United States Patent [19]
Arkles et al.

[11] Patent Number: 5,919,531
[45] Date of Patent: *Jul. 6, 1999

[54] TANTALUM AND TANTALUM-BASED FILMS AND METHODS OF MAKING THE SAME

[75] Inventors: Barry C. Arkles, Dresher, Pa.; Alain E. Kaloyeros, Slingerlands, N.Y.

[73] Assignees: Gelest, Inc., Tullytown, Pa.; The Research Foundation of State University of New York, Albany, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/824,581

[22] Filed: Mar. 26, 1997

[51] Int. Cl.$^6$ .................................................. C23C 16/08
[52] U.S. Cl. ....................... 427/576; 427/578; 427/253; 427/255; 427/255.1; 427/255.2; 427/255.7
[58] Field of Search ................................ 427/253, 255.1, 427/255.2, 255.7, 578, 576, 255

[56] References Cited

U.S. PATENT DOCUMENTS

| | | | |
|---|---|---|---|
| 2,820,722 | 1/1958 | Fletcher | 117/107 |
| 4,504,521 | 3/1985 | Widmer et al. | 427/85 |
| 4,608,271 | 8/1986 | Hieber et al. | 427/124 |
| 5,149,514 | 9/1992 | Sanjuro | 427/253 |
| 5,175,017 | 12/1992 | Kobayashi et al. | 427/253 |

OTHER PUBLICATIONS

Pierson, Handbook of Chemical Vapor Deposition, pp. 98–102 (no month), 1992.
Armas et al., Proc. Conf. Chem. Vap. Deposition Int. Conf., 5th, 695–703. (no month), 1975.
Takeo Oku et al., "Thermal Stability of WN$_x$ and TaN$_x$ Diffusion Barriers Between Si and Cu," Proceedings of the 12th International VLSI Multilevel Interconnection Conference (VMIC, Tampa, Florida) (1995), pp. 182–185. (no month).
S.C. Sun et al., "A Comparative Study of CVD TiN and CVD TaN Diffusion Barriers for Copper Interconnection," Proceedings of the IEDM, (1995), pp. 461–464. (no month).
S.C. Sun et al., "Diffusion Barrier Properties of CVD Tantalum Nitride for Aluminum and Copper Interconnections," Proceedings of the 12th International VLSI Multilevel Interconnection Conference (VMIC, Tampa, Florida) (1995), pp. 157–162. (no month).
L. A. Clevenger et al., "Comparison of High Vacuum and Barrier Performance Against Copper Penetration", *J. Appl. Phys.* vol. 73, No. 1 (Jan. 1993), pp. 300–308.
Karen Holloway et al., "Tantalum as a Diffusion Barrier Between Copper and Silicon: Failure Mechanism and Effect of Nitrogen Additions," *J. Appl. Phys.* vol. 71, No. 11 (Jun. 1992), pp. 5433–5444.

Mayumi Takeyama, et al., "Properties of TaN$_x$ Films as Diffusion Barriers in the Thermally Stable Cu/Si Contact Systems", *J. Vac. Sci. Technol.*, vol. B14, No. 2 (Mar./Apr. 1996), pp. 674–678.
M.H. Kiang et al., "Planarized Copper Interconnects by Selective Electroless Plating," *Mat. Res. Soc. Symp. Proc.*, vol. 265 (1992), pp. 187–197. (no month).
S.P. Murarka et al., "Advanced Multilayer Metallization Schemes with Copper as Interconnection Metal", *Thin Solid Films*, vol. 236, (1993), pp. 257–266. (no month).
J. Nucci et al., "In–Situ Analysis of the Microstructure of Thermally Treated Thin Copper Films," *Mat. Res. Soc. Symp. Proc.*, vol. 309, pp. 377–383. (no date).
D.P. Tracy et al., "Texture and Microstructure of Thin Copper Films," *Journal of Electronic Materials*, vol. 22, No. 6 (1993), pp. 611–616. (no month).
E. Kolawa et al., "Tantalum–Based Diffusion Barriers In Si/Cu VLSI Metallizations," *J. Appl. Phys.*, vol. 70, No. 3 (Aug. 1, 1991), pp. 1369–1373.
A. Katz et al., "Tantalum Nitride Films as Resistors on Chemical Vapor Deposited Diamond Substrates," *J. Appl. Phys.*, vol. 73, No. 10 (May 15, 1993).
Takehiko Takahashi et al., "Chemical Vapor Deposition of Tantalum Nitride Films," *Journal of the Less–Common Metals*, vol. 52 (1977), pp. 29–36. (no month).
Renaud Fix et al., "Chemical Vapor Deposition of Vanadium, Niobium, and Tantalum Nitride Thin Films," *Chem. Mater.*, vol. 5 (1993), pp. 614–619. (no month).
N. Seel et al., "Ab initio cluster study of the interation of fluorine and chlorine with the Si(111) surface," *The American Physical Society*," vol. 28, No. 4 (Aug. 1983), pp. 2023–2038.
"The National Technology Roadmap for Semiconductors," Semiconductor Industry Association, San Jose, CA (1994), pp. 10–15, 94–109. (no month).

*Primary Examiner*—Shrive Beck
*Assistant Examiner*—Timothy Meeks
*Attorney, Agent, or Firm*—Panitch Schwarze Jacobs & Nadel, P.C.

[57] ABSTRACT

A method for chemical vapor deposition of a film comprising tantalum onto a substrate includes introducing into a deposition chamber: (i) a substrate; (ii) a source precursor in the vapor state; and (iii) at least one carrier gas, and maintaining the temperature of the substrate within the chamber as from about 70° C. to about 675° C. for a period of time sufficient to deposit a film comprising tantalum on the substrate. The source precursor has a formula (I):

$$Ta(I_{5-m-n-p})(Br_{m-p})(Cl_{n-p})(R_p) \qquad (I)$$

wherein m is an integer from 0 to 5, n is an integer from 0 to 4, p is an integer from 0 to 4, and R is selected from the group consisting of hydrogen, and lower alkyl.

28 Claims, 10 Drawing Sheets

TANTALUM AND TANTALUM-BASED FILMS AND METHODS OF MAKING THE SAME

BACKGROUND OF THE INVENTION

The evolution of the computer integrated chip (IC) has been driven by the need to increase speed, performance, and functionality. The successful achievement of these objectives has required a radical change in chip architecture with the introduction of multilevel interconnect schemes which exploit the third (vertical) dimension in the chip in order to enhance device performance. This approach simultaneously minimizes any increase in overall interconnect line lengths and in chip size, or "real estate." These multilevel interconnect schemes are expected to average up to seven levels of interconnects within the next decade in what is commonly referred to as ultra-large scale integration (ULSI).

The changes in chip architecture have been accompanied by a continuing decrease in single device feature size in order to accommodate more devices per chip, leading to appreciable enhancement in chip functionality. In this respect, device features are expected to shrink from a nominal 0.5 $\mu$m today to less than 0.18 $\mu$m by the year 2000. However, the trend in decreasing feature size has encountered serious performance problems in terms of increased RC delay, where R is the resistance and C the capacitance, in interconnect structures.

Significant reduction in line resistance R could be achieved by replacing currently used metallization architecture, which consists of tungsten plugs and tungsten or aluminum interconnects, with a fully integrated copper based metallization scheme. Copper exhibits lower resistivity (bulk resistivity=1.68 $\mu$-ohm-cm) than aluminum and tungsten, which should yield up to 40% reduction in RC delay. It is also predicted to display enhanced electromigration and stress resistance, thus leading to higher reliability and improved performance.

However, a major problem in the realization of such structurally-stable, copper-based metallization architectures is the identification of an appropriate diffusion barrier and adhesion promoter which provides the performance required in sub-quarter-micron device technologies. Copper is known to be highly reactive with and a fast diffuser in silicon. Its presence in silicon leads to the formation of deep trap levels which ruin device performance. Currently titanium and titanium nitride technology is used, but is not expected to deliver the performance required, given the need for increasingly thinner liners, in order to maximize space availability for the actual conductor in the continuously shrinking device structures. Additionally, adhesion of copper to prior art titanium nitride diffusion barriers and adhesion promoters has been known to be problematic, especially if the titanium nitride has been exposed to air prior to the copper deposition step.

Tantalum-based compounds provide a potential solution to these problems. Tantalum and its binary and ternary nitrides are highly refractory materials which are stable to extremely high temperatures and which are known to be non-reactive with copper. Copper-tantalum contacts have a demonstrated stability up to 550° C., with the motion of copper being extremely slow through tantalum at the typical temperatures used in microelectronic device fabrication. Additionally, tantalum-based nitrides have even higher melting points than tantalum. Tantalum nitrides exhibit high melting points, for example, TaN and $Ta_2N$ have melting points of 2050° C. and 3087° C., respectively. These properties have led to the successful demonstration of sputtered tantalum nitrides as good diffusion barriers for copper-based technology, with proven copper-tantalum contact stability to temperatures as high as 750° C.

More importantly, the need for increasingly thinner liners make tantalum-based alloys inherently more desirable than their titanium counterparts. This may be because tantalum is a heavier (larger) ion than titanium, and accordingly tantalum-based alloys should provide the diffusion barrier performance required in ULSI structures at liner thicknesses which are significantly reduced in comparison with those of titanium alloys. The enhanced performance at reduced liner thicknesses ensures maximization of the useful space available for aluminum or copper conductors in the continuously shrinking device structures.

In this respect, ternary tantalum alloys, such as $TaN_xSi_y$, where x is greater than 0 and less than or equal to 2 and y is greater than 0 and less than or equal to 3, might be highly desirable in view of their unique structural properties. Not only do these compounds share the excellent diffusion barrier characteristics of their binary tantalum counterparts, but they also could be grown in amorphous form. The formation of the amorphous phase would eliminate the existence of grain boundaries, thereby preventing any potential metal, e.g. copper, diffusion pathways along such boundaries, and enhancing the barrier properties of the resulting $TaN_xSi_y$ phase.

One important application of pure tantalum is its ability to getter oxygen. As such, it provides a stable ohmic contact when deposited directly on silicon and alloyed to it to form a tantalum silicide, $TaSi_y$, phase with y being greater than zero and possibly less than or equal to 3. Traditionally, the formation of the tantalum silicide phase involves the deposition of pure tantalum on silicon, then either a single anneal or multiple anneals at high temperature (as high as 900° C.) to form the silicide phase. However, as semiconductor device sizes become smaller than a quarter of a micron, the consumption of silicon from the substrate in the silicidation process becomes highly undesirable and quite problematic, leading to contact reliability concerns, as well as possible current leakage and device performance issues. Clearly, a need exists for the development of deposition processes for the growth of tantalum silicide directly from the vapor phase, without the need for silicon consumption from the underlying substrate.

At present, tantalum and its binary and ternary nitrides are grown by conventional sputtering techniques. These techniques, unfortunately, are inherently incapable of conformal step coverage in aggressive trench and via structures, given their line of sight approach to metal deposition. Therefore, alternate processing techniques are required for growing tantalum-based films for applications in sub-quarter-micron devices. In this respect, chemical vapor deposition (CVD) is one of the most promising techniques. CVD displays an intrinsic potential for conformal coverage of aggressive via and hole structures, in view of its ability to use the substrate surface as a catalyst for the deposition reaction. In addition, CVD has a proven ability to deposit pure and doped materials at industrially viable growth rates over large substrate areas, such as a standard 200 mm wafer size which is currently used in the semiconductor industry.

Numerous CVD approaches have already been tested for the growth of tantalum and its nitrides. Inorganic CVD using tantalum pentachloride ($TaCl_5$) in a hydrogen, nitrogen, and argon atmosphere led to the deposition of TaN and $Ta_2N$ at temperatures in the range of 700–1000° C. See T. Takahashi, H. Itoh, and S. Ozeki, J., *Less-Common Met.* vol. 52, 29

(1977). Clearly, the high processing temperatures required prohibit the use of this deposition methodology in actual semiconductor devices. The high temperature is required to ensure complete dissociation of the tantalum-chlorine bonds in TaCl$_5$, and the subsequent reaction with ammonia to produce the nitride phase. Clearly, these high processing temperatures prohibit the use of such a CVD tantalum pentachloride-based deposition methodology in actual semiconductor devices. In addition, the inclusion of small amounts of chlorine (up to 5 at %) in the tantalum-based films is highly problematic, given chlorine's mobility out of the resulting nitride phase and into the surrounding layers, which causes significant corrosion and reliability problems.

Organometallic CVD approaches have been attempted which include the use of homoleptic dialkylamido tantalum complexes, and tributyldiethyl tantalum type sources. See S. C. Sun, M. H. Tsai, H. T. Chiu, S. H. Chuang, and C. E. Tsai, *Proceedings of the IEDM;* S. C. Sun, M. H. Tsai, C. E. Tsai, and H. T. Chiu, *Proceedings of the 12th International VLSI Multilevel Interconnection Conference* (VMIC, Tampa, Fla., 1995) p. 157; and R. Fix, R. G. Gordon, and D. M. Hoffman, *Chem. Mater.* vol. 5, 614 (1993). However, the organometallic CVD-based deposition methods did not encounter much success for a variety of reasons. In the case of tantalum, the organometallic CVD route was unable to produce pure tantalum films which were free of carbon and oxygen contaminants. In the case of nitrides, the low vapor pressure of the sources used in some cases made the resulting organometallic CVD process production unworthy, while the relative instability and short shelf life of the precursors used in some other cases created difficulties in transport, handling and storage.

However, none of the above approaches has led to the identification of an organometallic CVD process suitable for manufacturing which incorporates tantalum and its various nitrides and alloys into ULSI computer device structures.

Therefore, a critical need in the art exists for a method for providing tantalum- and tantalum-based films, preferably which are suitable for ULSI fabrication in manufacturing. A need in the art exists for tantalum-based films of an electronic grade, i.e., of an especially ultra-high quality, in terms of purity, with impurity concentrations well below 1 at %, which exhibit a non-columnar structure to perform appropriately as a barrier layer, and which are conformal to the complex topography of ULSI circuitry.

There is further a need in the art for a method which can readily prepare single films consisting of either pure tantalum, or tantalum-based films such as tantalum nitrides or bilayer or films which include appropriately dimensioned films of tantalum and its various alloys. There is also a need for a method which is amenable to process temperatures below about 675° C., and preferably below about 500° C. to prevent thermally induced damage to the device during processing.

There is also a need in the art for a process which allows for the preparation of the above-mentioned films sequentially and in situ, i.e., without the necessity of exposing a substrate coated with a tantalum-based film(s) to air during transport to another reaction chamber to deposit further film(s). According to prior art methods, the production of bilayer or multilayer structures typically involves the laying down of a first layer in a first reaction chamber, and then transferring the substrate to a different reaction chamber(s) where the subsequent layer(s) are coated onto the already grown layer(s) in a fashion which typically exposes the substrate to air. The prior art processes do not provide a single reaction chamber with the versatility to deposit tantalum and its nitrides merely by controlling the operating parameters of the chamber. The prior art also does not provide for the deposition of tantalum and/or its nitrides in two or more chambers interconnected by vacuum load locks or central handlers which allow sample transfer between reactors without exposure to air.

In particular, a process for the in situ deposition of sequential bilayers or multilayers of tantalum and its nitrides is desirable, in part, because of the high affinity of tantalum for oxygen and water. This affinity leads typically to contamination of the tantalum-based film surface during transfer to a second reaction chamber where it is coated with the subsequent layer(s) in a manner which exposes the layers to air.

SUMMARY OF THE INVENTION

The present invention includes a method for the chemical vapor deposition of a film comprising tantalum onto a substrate. The method comprises introducing into a deposition chamber: (1) a substrate; (2) a source precursor in the vapor state and having the formula (I):

$$Ta(I_{5-n-p})(Br_{m-p})(Cl_{n-p})(R_p) \qquad (I)$$

wherein m is an integer from 0 to 5, n is an integer from 0 to 4, p is an integer from 0 to 4, and R is selected from the group consisting of hydrogen and lower alkyl and (3) at least one carrier gas. The temperature of the substrate within the chamber is maintained at from about 70° C. to about 675° C. for a period of time sufficient to deposit a film comprising tantalum on the substrate.

In one embodiment, the method further comprises depositing a second film comprising tantalum on the film deposited on the substrate for forming a multilayered structure while the substrate remains fixed in the chamber. The second film comprising tantalum is selected from the group consisting of a pure tantalum film, a TaN$_x$ film, wherein x is greater than 0 and less than or equal to about 2, a TaSi$_y$ film, wherein y is greater than 0 and less than or equal to about 3, and a TaN$_x$Si$_y$ film, wherein x is greater than 0 and less than or equal to about 2 and y is greater than 0 and less than or equal to about 3.

In a further embodiment, the method further comprises using a silicon substrate and heating the substrate and deposited film comprising tantalum to a temperature of from about 700° C. to about 950° C. for providing silicon to the deposited film comprising tantalum.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
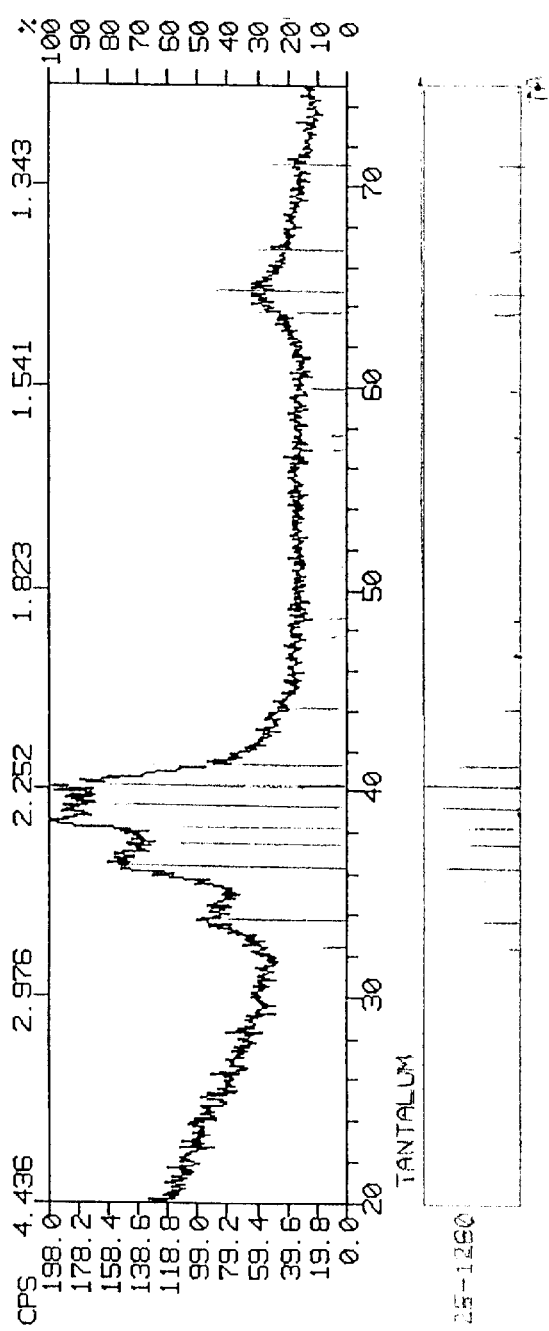
FIG. 1 is a representation of an x-ray diffraction pattern of a tantalum film produced by the plasma CVD reaction of TaBr$_5$ and hydrogen in Example 1 according to one embodiment of the method of the present invention.

The present invention relates to halide-based chemical precursors and associated thermal and plasma methods for the chemical vapor deposition on various specialty substrates of conformal tantalum, tantalum nitride alloys including $TaN_x$, wherein x preferably has any value ranging from greater than 0 and less than or equal to about 2, tantalum silicide alloys including $TaSi_y$, wherein y preferably has any value ranging from greater than 0 and less than or equal to about 3, and tantalum silicide nitride alloys including $TaN_xSi_y$, wherein x and y are preferably as defined above. The invention deposits such films as a metallization layer in the form of a single tantalum-based film on a substrate, or as several such films layered on a substrate forming a multi-layered structure.

Such films are useful on substrates such as semiconductor substrates, for example, silicon and gallium arsenide substrates, having sub-micron features and structures. The single or multilayered films can be deposited ex situ in different reactors, or in situ in a single reactor, or a combination thereof. For example, several layers can be deposited in a single reactor and a subsequent layer can be deposited in a separate reactor. When more than one reactor is used, the reactors are preferably interconnected through leak-tight transfer arms and load locks which allow sample transfer between the different reactors without exposing the coated substrate to air.

In microelectronic applications, a preferred substrate is intended to become an integrated circuit, and has a complex topography formed of holes, trenches, vias, and the like, to provide the necessary connections between materials of various electrical conductivities that form a semiconductor device. The substrate is preferably formed of, for example, silicon, silicon dioxide, silicon nitride, or doped versions and mixtures thereof.

The substrates of the invention are more preferably intended for ULSI circuitry, and are patterned with holes, trenches, and other features with diameters of less than 1.0 micron, often less than 0.50 micron, and even 0.25 micron or less. Substrates having such small features are known or herein as "sub-quarter-micron" substrates. Sub-quarter-micron substrates which may be coated according to the invention also typically have features with high aspect ratios, from about 3:1 to about 6:1 and beyond, where the aspect ratio is defined as the ratio of a feature's depth to its diameter, as viewed in cross section. As used herein, sub-quarter-micron substrates have feature diameters less than about 0.25 micron, and the aspect ratio of the features is typically larger than about 3:1. Features having an aspect ratio of about 4:1 and beyond are found on most substrates for ULSI circuitry.

Examples of substrates which may be coated include semiconductor substrates as mentioned above, or metal, glass, plastic, or other polymers, for applications including, for example, hard protective coatings for aircraft components and engines, automotive parts and engines and cutting tools; cosmetic coatings for jewelry; and barrier layers and adhesion promoters for flat panel displays and solar cell devices. Preferred metal substrates include aluminum, beryllium, cadmium, cerium, chromium, cobalt, copper, gallium, gold, iron, lead, manganese, molybdenum, nickel, palladium, platinum, rhenium, rhodium, silver, stainless steel, steel, iron, strontium, tin, titanium, tungsten, zinc, zirconium, and alloys and compounds thereof, such as silicides, carbides and the like.

There is really no limitation on the type of substrate which can be used in the present method. However, the substrate is preferably stable at the conditions used for depositing the film or films onto the substrate. That is, the substrate is preferably stable to temperatures of from about 70° C. to about 950° C., and preferably from about 70° C. to about 700° C., depending on the type of film to be deposited and the intended use of the coated substrate.

According to the CVD processes used in the method of the present invention, conformal single, bilayer or other multilayer films may be placed on sub-quarter-micron substrates. Conformal coatings of tantalum, tantalum nitride, tantalum silicide and tantalum nitride silicide, may be placed on sub-quarter-micron substrates having feature diameters of about 0.25 micron, or smaller, and with aspect ratios as much as about 6:1, and larger.

As used herein, "conformal coating" refers to a coating that evenly covers a substrate having a complex topography. The evenness of the coating can be measured by, for example, examining the thickness of the coating along the walls and bottom of a hole in the substrate, and determining the variation in the thickness of that coating. According to the invention, sub-quarter-micron substrates are conformally coated, when the coating has a thickness, measured at any point normal to the surface of a wall or floor of a hole in the surface of the substrate, which is within 25% of the thickness at any other point in the hole. According to a preferred embodiment, the variation in coating thickness is within 10%, i.e., at no point is the thickness of the coating either 10% greater or 10% smaller than the average thickness of the coating.

As used herein, particularly when referring to ULSI devices and coated substrates useful therein, "step coverage" refers to the ratio of the coating thickness at the bottom of a feature such as a trench or via, to the thickness of the coating on the top surface of the substrate adjacent to the feature, where the ratio is multiplied by 100 to provide a percent value. The process of the invention provides conformally coated sub-quarter-micron substrates having step coverage of greater than about 70% in sub-quarter-micron structures.

The invention uses halide-based complexes for the low temperature growth of either tantalum and its nitrides and/or its silicide alloys, depending on the reactants employed. In situ, sequential CVD processes using a single halide precursor can be used to smoothly and reversibly change between tantalum and its nitrides and/or silicide alloys by appropriately modifying the processing conditions. It also provides CVD processes which can exploit different halide precursors to sequentially deposit each of a wide variety of pure tantalum or tantalum-based layers necessary for a particular application.

The invention includes a method for the CVD of a film which comprises tantalum, i.e., a pure tantalum or tantalum-based film, onto a substrate. The method includes introducing into a deposition chamber a substrate, a source precursor and at least one carrier gas which may function as a carrier and/or a reactant. However, for convenience purposes, this gas will be referred to generally herein as at least one "carrier" gas. The source precursor is introduced in the vapor state, and preferably has the following formula:

$$Ta(I_{5-m-n-p})(Br_{m-p})(Cl_{n-p})(R_p) \quad (I)$$

wherein m is an integer from 0 to 5, n is an integer from 0 to 4, p is an integer from 0 to 4, and R may be hydrogen or lower alkyl, for example, and preferably, methyl or neopentyl.

According to one preferred embodiment, the source precursor of formula (I) is $TaBr_5$ or $(CH_3)_3TaBr_2$, and the substrate is a silicon or silicon dioxide wafer useful in the manufacture of an ULSI device. The bonding configuration and associated electronic environment in tantalum pentabromide and tantalum pentaiodide, among other halides which may be used as the sources precursors, are quite different from tantalum pentabromide as used in the prior art. The use of these precursors of the present invention create corresponding dissociation energies which are significantly lower than that of tantalum pentachloride, and accordingly, have the ability to deposit tantalum-based films at significantly lower processing temperatures than those necessary for tantalum pentachloride.

Additionally, the activation energy, for example, for iodine or bromine diffusion is expected to be significantly higher than chlorine, given that I or Br are much heavier than Cl. See, M. Seel and P. S. Bagus, Phys. Rev. B28, 2023 (1983), including a study of the interaction of fluorine and chlorine with Si(111), and showing that the barrier for chlorine penetration into the silicon surface is much larger than that for fluorine. This behavior was a consequence of the larger size, and hence ionicity and resulting coulomb interaction, of the chlorine atom in comparison with the fluorine atom. This property has important implications for the effects of residual halide incorporation in tantalum-based films, with a certain concentration of iodine or bromine requiring appreciably higher thermal energy to diffuse out of the film lattice than chlorine.

The at least one carrier gas is preferably hydrogen, helium, oxygen, fluorine, neon, chlorine, argon, krypton, xenon, carbon monoxide, nitrogen, ammonia, hydrazine, nitrous oxide, and/or water vapor. The gas can be varied depending upon the type of film to be formed. For example, for forming pure tantalum film, the gas is preferably hydrogen, helium, oxygen, fluorine, neon, chlorine, argon, krypton, xenon, carbon monoxide, carbon dioxide, and water vapor. Most preferably, for forming pure tantalum films, the at least one gas is hydrogen, helium, xenon, and/or argon, more preferably, the gas is hydrogen or hydrogen in combination with argon or xenon.

The source precursor, the at least one carrier gas and substrate are maintained in the chamber at an interior reaction temperature of from about 70° C. to about 675° C., preferably at least 100° C. Most preferably, a plasma having a plasma power density of from about 0.01 to about 10 $W/cm^2$ is provided to the chamber. The plasma preferably has a frequency of from about 0 Hz to about $10^8$ Hz. The components are maintained under these conditions for a period of time sufficient to deposit a pure tantalum or tantalum-based film onto the substrate. The deposition step typically takes from about 30 seconds to about 30 minutes depending upon the type of tantalum-based film to be deposited, the processing conditions and the desired film thickness.

According to a further embodiment of the method, a tantalum nitride alloy film is deposited by CVD on a substrate. Tantalum nitride alloys, such as $TaN_x$, wherein x can be any value greater than 0 and less than or equal to about 2, are deposited by introducing into the deposition chamber the substrate, the source precursor of formula (I) above, at least one carrier gas as listed above, most preferably a gas which includes nitrogen such as, for example, nitrogen, ammonia or hydrazine, and a further nitrogen-containing reactant gas which may be the same or different from the at least one carrier gas. The nitrogen-containing reactant gas is preferably selected from the group consisting of nitrous oxide, ammonia, nitrogen, and hydrazine. Preferably, the at least one carrier gas and the nitrogen-containing reactant gas are used in a combination of hydrogen, nitrogen, argon, ammonia, and/or hydrazine. These components are maintained in the deposition chamber at a temperature of from about 70° C. to about 675° C., and preferably at least 100° C. Most preferably, for forming tantalum nitride alloy films, the temperature in the chamber is from about 250° C. to about 500° C. The substrate is maintained in the chamber for a time sufficient to deposit the tantalum nitride alloy film. It is preferred that for forming tantalum nitride alloy films, the compound of formula (I) is $TaBr_5$ or $(CH_3)_3TaBr_2$, with the substrate being a silicon or silicon dioxide wafer useful in the manufacture of a ULSI device.

The tantalum nitride alloys are most preferably deposited using as the at least one carrier gas, one or more of the following: hydrogen; hydrogen in combination with nitrogen, ammonia, argon, xenon, and/or hydrazine; nitrogen in combination with ammonia, argon, and/or xenon; or ammonia in combination with argon and/or xenon.

Preferably the components are maintained in the chamber in the presence of a plasma having a plasma power density of from about 0 to 10 $W/cm^2$, more preferably from about 0.01 to about 10 $W/cm^2$ for a period of time sufficient to deposit the tantalum-based film, i.e., the tantalum nitride alloy film on the substrate. According to this embodiment, the source precursor is most preferably $TaBr_5$, in combination with an at least one carrier and/or reactant gas and additional nitrogen-containing reactant gas which is either nitrogen, ammonia, and/or hydrazine, being deposited on a silicon or silicon dioxide wafer substrate for use in the manufacture of a ULSI device.

Alternating or sequentially deposited multilayers of pure tantalum and/or tantalum nitride alloy films may be provided to the substrate preferably while the substrate is kept in a single deposition reactor. The substrate and source precursor are provided to the deposition chamber, the source precursor being in the vapor state. The preferred gas is then provided for forming alternating or sequential film layers at the preferred deposition chamber temperatures as noted above. Either the tantalum metal film or tantalum nitride alloy film can be deposited first onto the substrate and the layers can be alternated or applied in any given order or sequence.

Alternatively, such alternating or sequential multiple layers of pure tantalum or tantalum nitride alloy can be deposited on a substrate while the substrate is moved within the single deposition reactor. Further, the multiple layers can be provided to the substrate while the substrate is moved between two or more separate reactors, each used for deposition of one or more of the tantalum or tantalum nitride alloy layers depending upon the particular application of the coated substrate. Either the pure tantalum film or tantalum nitride film can be deposited first onto the substrate. The substrate is moved from one reactor, where one or more such layer is deposited, to another reactor(s), where additional layer(s) are deposited. Preferably, the reactors are interconnected through leak-tight transfer arms and/or load locks which allow sample transfer between the different reactors without exposing the coated substrate to air.

According to a further, preferred embodiment, a pure tantalum film or tantalum nitride alloy film is deposited onto the substrate to provide a coated substrate, and then a series of tantalum-based films, such as pure tantalum or tantalum nitride are deposited onto the coated substrate, preferably with increasing nitrogen concentration in subsequent layers. The tantalum film and the tantalum nitride alloy films are formed as described above.

The present invention uses CVD methods to prepare pure (electronic grade) tantalum and tantalum nitride alloy films, for example, for use as diffusion barriers or as adhesion interlayers in integrated circuit fabrication, and in particular in ULSI fabrication. The method of the present invention directs the carefully selected precursors to either a thermal or plasma-promoted CVD reactor, under preferred reaction conditions, to achieve the high quality tantalum-based films.

In addition to the tantalum nitride alloy films described above, tantalum silicide nitride alloy films and tantalum silicide alloy films may also be prepared according to the present method as discussed in more detail below. Such films can also be formed in multilayered laminated structures, for example, bilayer films of tantalum and tantalum nitride, bilayer films of tantalum and tantalum silicide nitride, and multilayered films of tantalum and tantalum-nitride films in either alternating or sequential configurations.

To prepare the tantalum and tantalum-based films according to the present invention, thermal CVD or plasma-promoted CVD may be used. "Thermal CVD" refers to a CVD process wherein all reactants are introduced into the CVD reactor in gaseous form, and the energy necessary for bond cleavage is supplied entirely by thermal energy. "Plasma-promoted CVD" refers to a CVD process wherein all reactants are introduced into the CVD reactor in gaseous form, and the energy necessary for bond cleavage is supplied in part by the high energy electrons formed in a glow discharge or plasma having a plasma power density of from about 0 to about 100 $W/cm^2$, preferably from about 0.01 to about 10 $W/cm^2$, and more preferably below 0.5 $W/cm^2$. Plasma-promoted CVD takes advantage of the high energy electrons present in glow discharges to assist in the dissociation of gaseous molecules, as is the case of plasma-enhanced CVD where plasma-enhanced CVD is a generally well-known technique in the art. However, in contrast to plasma-enhanced CVD, which uses high plasma power densities, the low power densities employed in plasma-promoted CVD do not cause premature precursor decomposition in the gas phase, thus preventing undesirable film contamination. Additionally, the use of a low power plasma density prevents electrical damage to the film and substrate.

Any CVD reactor having the following basic components may be used with the method of the present invention: a precursor delivery system which is used to store and control the delivery of the source precursor, a vacuum chamber, a pumping system to maintain an appropriately reduced pressure, a power supply to create the plasma discharge for plasma-promoted CVD, a temperature control system, and gas or vapor handling capability to meter and control the flow of reactants and products resulting from the process. The precursor delivery system may be any of the following: a pressure-based bubbler or sublimator, a hot-source mass flow controller, a liquid delivery system, direct liquid injection system or similar apparatus.

In depositing tantalum-based films according to the present invention, the source precursor is preferably placed in a reservoir which could be heated by a combination of resistance heating tape and associated power supply to a temperature which is high enough to ensure the precursor's sublimation or vaporization, but not so high as to cause premature decomposition of the precursor. A mass flow controller, which may be isolated from the reservoir by a high vacuum valve, is preferably provided to help control gas flow into the reservoir. Gas, for example, hydrogen, helium, argon, xenon and nitrogen, may function as a carrier agent when a conventional pressure- and/or temperature-based mass flow control delivery system is used as a delivery system for precursor into the CVD reactor chamber. Alternatively, such gases may function as pressurizing agents when using a liquid delivery system for the delivery of the precursor to the CVD reactor. Such a system may include a combination micropump and vaporizer head. A suitable example of such a system is the MKS Direct Liquid Injection system. A further example of a suitable delivery system for the source precursor is a hot source mass flow controller, for example, an MKS Model 1150 MFC, which does not require the use of a carrier or pressurizing gas. A further example is a solid source delivery system, for example, the MKS 1153 system, which does not require the use of a carrier or pressurizing gas.

In a preferred embodiment, the precursor vapor (or precursor and carrier gas depending upon the delivery system being used) is preferably transported into the CVD reactor through delivery lines which are maintained at the same temperature as the reservoir, using a combination of resistance heating tape and an associated power supply, to prevent precursor recondensation. The CVD reactor may be an eight-inch wafer, cold-wall, stainless steel CVD reactor preferably equipped with plasma generation capability. The plasma may be generated by various sources, such as direct current plasma, radio frequency plasma, low frequency plasma, high density plasma, electron cyclotron plasma, inductively coupled plasma, microwave plasma or other similar sources. The plasma may be used for dual purposes. It may be used for in situ pre-deposition substrate cleaning, and for actual deposition if using plasma-promoted CVD.

The reactor is preferably also equipped with an electrical bias on the substrate. The bias can be derived from direct current, a low radio frequency of less than 500 kHz, a high radio frequency of from 500 kHz to about $10^6$ kHz, or a microwave frequency of from about $10^6$ kHz to about $10^8$ kHz and similar sources.

Evacuation of the CVD deposition reactor is possible using various pumping systems. Two such systems are preferred. One system is a high vacuum ($10^{-6}$ torr or more) pumping system, which may use either a cryogenic- or turbomolecular-type pump. This system ensures a high vacuum base pressure in the reactor. A vacuum system having a roots blower or dry pump may also be used for handling the high gas throughput during CVD runs. Both pumping units are preferably isolated from the CVD reactor by high vacuum gate valves.

The CVD reactor is preferably equipped with a high vacuum load-lock system which is used for transporting and loading substrates as large as about 300 mm wafers into the reactor. Alternatively, the reactor may interface with a vacuum central handler unit which may be used to transfer the substrate between multiple CVD reactors to deposit sequential or alternating layers of tantalum and/or tantalum-based films.

After being charged to the reservoir, the source precursor is heated to a temperature which is high enough to ensure the precursor's sublimation or vaporization, but not so high as to cause its premature decomposition. Preferably, the source precursor is heated to a temperature of from about 50° C. to about 200° C. When conventional pressure- and/or temperature-based mass flow control type or a solid-source-type delivery systems are used to control the flow of precursor into the CVD reactor, the precursor in the reservoir is heated. Alternatively, when a liquid delivery system is used, for example, the MKS Direct Liquid Injection system consisting of a combination micropump and vaporizer head, the liquid in the reservoir is room temperature. In such a liquid delivery system, the vaporizer head, not the liquid in the reservoir, is heated to a temperature which is high enough to ensure the precursor's sublimation or vaporization, but not so high as to cause its premature decomposition.

When a gas is used, any gaseous substance may be used which is substantially not reactive with the source precursor or which reacts with the source precursor to form an intermediate product which is more easily transported to the reaction zone and/or could more readily decompose to yield the desired tantalum or tantalum-based film. Exemplary carrier gases are listed above. Hydrogen is particularly preferred as a carrier gas for both thermal CVD and plasma-promoted CVD. The flow rate of carrier gas may vary from about 10 standard $cm^3$/min to about 5 standard l/min, and preferably from about 10 to about 100 $cm^3$/min, for both thermal CVD and plasma-promoted CVD.

In all modes of delivery described above, the flow rate of the vapor of the source precursor could range from about 0.01 to about 2000 standard $cm^3$/min. Preferably the flow rate of source precursor vapor into the CVD chamber is from about 0.1 to about 100 standard $cm^3$/min.

The carrier gas which may also function as a reactant gas, is preferably hydrogen for both thermal CVD and plasma-promoted CVD of pure tantalum films. Ammonia or hydrazine, singly or mixed with hydrogen, are particularly preferred carrier/reactant gases for both thermal CVD and plasma-promoted CVD of tantalum nitride and other tantalum-based films. The flow of carrier and/or reactant gas, which may be a single gas or a mixtures of gases, is preferably from about 10 standard $cm^3$/min to about 10 standard l/min, and more preferably from about 100 standard $cm^3$/min to about 5 standard l/min. The corresponding reactor pressure is preferably 10 mtorr for low pressure to 1000 torr for atmospheric pressure CVD, and more preferably from about 100 mtorr to 15 torr.

Although for convenience purposes, the gas(es) discussed herein are referred to as "carrier" gas(es) or "reactant" gas(es), the function of these gases should not be misconstrued. In fact, in addition to carrying the vapor of the source precursor into the reaction chamber, the carrier gas may also undergo reaction in the chamber during the deposition process. Also, a so-called "reactant" gas as introduced may include inert components, in which case some or all of the reactant gas may serve merely to dilute the reactive atmosphere inside the deposition chamber. Likewise, the carrier gas may include inert components.

According to a preferred embodiment of plasma-promoted CVD for forming a tantalum film, hydrogen is the carrier gas and there is no reactant gas, because the hydrogen plasma acts as the catalyzing agent to decompose the precursor on the substrate. According to another preferred embodiment of plasma-promoted CVD for forming a tantalum film, hydrogen is introduced into the deposition chamber simultaneously as the carrier and reactant gas. According to another preferred embodiment for forming tantalum film, hydrogen is introduced into the deposition chamber simultaneously with an inert gas such as neon, argon, krypton, and/or xenon as the at least one carrier gas. Preferably, hydrogen is introduced to function as a reactant and at least one of argon and xenon to function only as a carrier. However, an inert gas may be introduced in admixture with hydrogen, and the gas mixture which would be introduced as the at least one carrier gas, may function as a carrier and a reactant.

Pure tantalum film may also be prepared using thermal CVD according to the invention. To prepare a pure tantalum film by thermal CVD, for example, hydrogen, argon, and/or xenon may be introduced as the at least one carrier gas to function as the reactant in the deposition chamber. At least one of hydrogen, or the inert gas may function as carrier. According to a preferred embodiment, argon functions as a carrier and hydrogen functions as a reactant in the at least one carrier gas.

Plasma-promoted CVD according to the present invention may also be used to prepare tantalum-based films, such as tantalum nitride alloys. In one preferred embodiment for the preparation of tantalum nitride films, in the form of TaN, by plasma-promoted CVD, a nitrogen-containing reactant gas must be introduced into the chamber. Nitrogen, ammonia and hydrazine are preferred nitrogen-containing reactant gases according to the invention. When nitrogen is the nitrogen-containing reactant gas, it may function as a carrier and a nitrogen-containing reactant gas, and hydrogen or an inert gas such as argon or xenon may also be introduced simultaneously as the at least one carrier therewith functioning either as a carrier and/or a reactant. Preferably, at least one of hydrogen, nitrogen, and an inert gas functions as the at least one carrier gas. Hydrogen, nitrogen and/or an inert gas may also be co-introduced as a combined reactant gas, i.e., hydrogen and/or an inert gas may be in admixture with the ammonia or hydrazine gas. Nitrogen in combination with at least one of ammonia and hydrazine may be the sole gases present in the deposition chamber during the preparation of tantalum-nitride films, in which case nitrogen may function as the at least one carrier gas with any of these three gases being the nitrogen-containing reactant gas. According to one preferred embodiment to prepare TaN film by plasma-promoted CVD, hydrogen and nitrogen are introduced into the reaction chamber simultaneously with the source precursor.

Tantalum-based films may also be prepared using thermal CVD according to the invention. To prepare a tantalum-based film such as tantalum nitride film by thermal CVD, for example, ammonia, nitrogen, and/or hydrazine may be introduced as a nitrogen-containing reactant gas into the deposition chamber, and the at least one carrier gas such as hydrogen, nitrogen, or an inert gas such as argon or xenon may be provided to function as the carrier and/or a reactant. According to a preferred embodiment, hydrogen functions as a carrier and ammonia as a nitrogen-containing reactant gas.

When ammonia or hydrazine is the nitrogen-containing gas during plasma-promoted CVD of tantalum nitride films, then it is preferably introduced into the deposition chamber as a reactant gas, and hydrogen and/or an inert gas such as argon or xenon preferably function as the carrier. Hydrogen and/or an inert gas may also be co-introduced as an admixed reactant gas, with, for example, ammonia and/or hydrazine gas.

Regardless of whether thermal CVD or plasma-promoted CVD is used to prepare the tantalum nitride film, and regardless of the exact identities of the nitrogen-containing reactant gas and the at least one carrier gas which can function as a carrier and/or reactant gas, it is important to maintain at least one mole of nitrogen atoms in the reaction chamber for each mole of tantalum in the reaction chamber if stoichiometric TaN is desired. If less than a stoichiometric amount of nitrogen is present in the deposition chamber, then tantalum metal or a tantalum-rich film, such as $Ta_2N$, or $TaN_a$, where a <1, will be deposited. This could allow the formation of a mixed phase film, i.e., a film having phases of pure tantalum and tantalum-rich nitrides. While a mixed phase film is preferred for some applications, and methodology to prepare such tantalum-based films and substrates having these films coated thereon is within the scope of the invention, if pure TaN film is to be deposited for a specific use, i.e., a film having a Ta:N molar ratio of 1:1 then an adequate supply of nitrogen atoms must be provided to the deposition chamber.

Additionally, regardless of whether thermal CVD or plasma-promoted CVD is used to prepare the tantalum-nitride film, and regardless of the exact identities of the nitrogen-containing reactant gas and the carrier and/or reactant gases, it is important to maintain an excess of nitrogen atoms, i.e., more than one mole of nitrogen atoms in the reaction chamber for each mole of tantalum in the reaction chamber, if a nitrogen-rich Ta-based film is desired. If excess nitrogen is present in the deposition chamber, then a nitrogen rich film, such as $TaN_z$, where z>1, will be deposited. This also could allow the formation of a mixed phase film, i.e., a film having phases of pure tantalum, tantalum-rich nitride, and nitrogen-rich nitride.

In one embodiment of the method, preferably using either thermal CVD or plasma-promoted CVD, when forming a pure tantalum or tantalum nitride alloy film, using any of the above-mentioned carrier and/or reactant gases, a silicon-containing compound, preferably in the vapor state, is provided to the reaction chamber. The additional silicon provides a tantalum silicide phase, preferably $TaSi_y$, wherein y may be any value greater than 0 and up to and including 3, or a tantalum nitride silicide phase, preferably $TaN_xSi_y$, wherein x is greater than 0 and less than or equal to about 2 and y is greater than 0 and less than or equal to about 3. The silicon-containing compound is preferably a halide-based compound of formula (II):

$$Si(I_{4-m-n-p})(Br_{m-p})(Cl_{n-p})(R_p) \qquad (II)$$

wherein m is an integer from 0 to 4, n is an integer from 0 to 4, p is an integer from 0 to 4, and R is defined in the same manner as for formula (I) above.

The plasma used in plasma-promoted CVD may be generated by any of the plasma sources described above. The plasma frequency may range from 0 Hz to about $10^8$ kHz or more, and preferably from about 1 MHZ to about $10^6$ kHz. Plasma power densities preferably range from about 0.01 to 10 $W/cm^2$, and more preferably from 0.01 to 0.5 $W/cm^2$.

An electrical bias such as those described above, may also be applied to the substrate. The corresponding power density preferably ranges from about 0.001 $W/cm^2$ to $10^3$ $W/cm^2$, and more preferably 0.001 $W/cm^2$ to 10 $W/cm^2$.

An alternative method of providing silicon to a tantalum or tantalum nitride alloy film deposited according to the present invention is by using a silicon-based or polysilicon-based substrate. After the tantalum or tantalum-nitride film is formed, the temperature of the substrate in the reactor is typically raised to a temperature high enough to cause the silicon to react with the tantalum or tantalum nitride phase in the film, preferably from about 700° C. to about 950° C. such that the silicon from the substrate reacts with the tantalum in the film formed on the substrate to provide a tantalum silicide or tantalum nitride silicide phase. The type and amount of silicide phase provided to the film depends on the type of reactant and/or carrier gas used and the processing temperature, as discussed above. In these cases, the silicide phase may be provided without the use of a silicon-containing compound in the vapor state such as the halide-based compound of the general formula (II).

The tantalum and tantalum-based films formed in accordance with the present invention may advantageously be tailored to columnar or non-columnar structures. The tantalum and tantalum-based films of the invention also have excellent ohmic contact properties when formulated into ULSI circuitry. Also, the tantalum and tantalum-based films have excellent adhesion properties and act as good barriers to metal diffusion when formulated into ULSI circuitry.

The inventive tantalum-based films, whether prepared by thermal or plasma-promoted CVD, typically have a nitrogen to tantalum ratio of about 0 to 2 and a silicon to tantalum ratio of from about 0 to 3.

While the invention allows the separate and independent production of pure tantalum and tantalum-based films, the inventive method also provides for in situ sequential CVD processes in which the deposition mode of a single tantalum precursor is smoothly and reversibly switched between forming a pure tantalum film and tantalum-nitride film, by changing the reactant gases which can also function as carrier gases.

Thus, according to one preferred embodiment of the inventive method, the deposition reactor may be charged with a vapor from a compound of formula (I), in the presence of hydrogen and a plasma having a plasma power density of about 0.01 $W/cm^2$ to about 0.5 $W/cm^2$. As described previously, these reaction conditions result in the formation of a pure tantalum film on a substrate. The plasma may then be turned off, and the reactant gas changed from hydrogen to a nitrogen-containing reactant gas such as ammonia. Under these revised reaction conditions, a film of $TaN_x$, wherein x is as defined above, is deposited on top of the previously deposited pure tantalum film, thereby providing a bilayer film on a substrate.

According to another preferred embodiment of the inventive method, the deposition reactor is charged with a vapor from a compound of formula (I), in the presence of hydrogen and a plasma having a plasma power density of about 0.01 W/cm² to about 0.5 W/cm² to form a pure tantalum film on a substrate. The plasma may then be turned off, and a nitrogen-containing reactant gas, such as ammonia introduced along with a vapor of a different source precursor according to formula (I). Under these revised reaction conditions, a film of $TaN_x$ is deposited on top of the initially deposited pure tantalum film, to provide a bilayer film of the invention.

In situ, sequential CVD can also be used with a single source precursor and a single silicon-containing compound in vapor form to smoothly and reversibly switch between a pure tantalum film, a $TaSi_x$, and a $TaN_xSi_y$, by changing reactant gases which may also function as a carrier gas or gases. Thus, according to one preferred embodiment of the method, the deposition reactor is charged with a vapor from a source precursor according to formula (I), in the presence of hydrogen and a plasma having a plasma power density of about 0.01 W/cm² to about 0.5 W/cm² to form a pure tantalum film on the substrate. The plasma is then turned off, and the reactant gas changed from hydrogen to a nitrogen-containing reactant gas such as ammonia which may also function as a carrier gas. A vapor of a silicon-containing compound of formula (II) is also introduced into the deposition reactor along with the nitrogen-containing reactant gas. Under these revised reaction conditions, a film of $TaN_xSi_y$, wherein x and y are independently greater than 0 and less than or equal to about 2, is deposited on top of the initially deposited pure tantalum film, to provide a bilayer film on the substrate.

According to another preferred embodiment of the inventive method, the deposition reactor is charged with a vapor of a source precursor according to formula (I), in the presence of hydrogen and a plasma having a plasma power density of about 0.01 W/cm² to about 0.5 W/cm² to form a pure tantalum film on the substrate. The plasma is then turned off, and the reactant gas is changed from hydrogen to a nitrogen-containing reactant gas such as ammonia. A vapor of a different source precursor according to formula (I) may also be introduced into the deposition reactor instead of the first source precursor, along with vapor of a silicon-containing compound according to formula (II). Under these revised reaction conditions, a film of $TaN_xSi_y$, wherein x and y are as defined above, is deposited on top of the initial pure tantalum film, to provide a bilayer film.

It should be understood, based on this disclosure, that any of the above described embodiments could be reversed or otherwise modified with respect to sequence, e.g., either of the tantalum nitride, tantalum silicide or tantalum nitride silicide films could be initially deposited on the substrate, followed by the deposition of a tantalum or other tantalum-based film. Preferably, the pure tantalum film is initially deposited in contact with the substrate, which is preferably a silicon or silicon-containing substrate. It should be also understood, based on this disclosure, that more than two compositionally diverse layers may be deposited on a substrate, without the need to remove the substrate from the reaction zone.

It should also be understood, based on the disclosure, that any suitable CVD technology for preparing a tantalum or tantalum-based film, alone or in combination, may be used in accordance with the method of the present invention. For example, thermal CVD using a hydrogen carrier gas may be used to deposit a pure tantalum film, followed by use of plasma-promoted CVD using hydrogen and nitrogen as an at least one carrier gas and/or a nitrogen-containing reactant gas to deposit a tantalum nitride film for producing a bilayer film on a substrate.

The in situ deposition of tantalum and tantalum-based bilayers and multilayers as described is very convenient for the preparation of ULSI devices. The inventive method allows for formation of a bilayer or multilayer without the necessity of transferring the partially coated substrate between reaction chambers risking exposure to air. That the bilayer or multilayer can be made in a single reaction chamber greatly minimizes the risk of contamination of the film, which may occur during transfer of the partially coated substrate between reaction chambers. Contamination is particularly a problem for tantalum and tantalum-based films, because tantalum is typically reactive with oxygen, and a slight amount of such contamination could destroy the usefulness of the tantalum or tantalum-based coatings in ULSI devices.

The method of the present invention uses selected perhalogenated tantalum compounds as source precursors which can be converted by use of thermal or plasma-promoted CVD into high-quality tantalum and tantalum-based films. Similarly, the invention provides electronic grade tantalum-nitride films by reacting the same perhalogenated tantalum compound source precursors with nitrogen-containing reactant gases, and electronic grade tantalum silicides and/or tantalum silicide nitrides by reacting the same precursors with at least one carrier and/or reactant gas, a vapor of a silicon-containing compound and/or a nitrogen-containing reactant gas which may be the same or different from the at least one carrier and/or reactant gas. Exemplary chemical reaction formulas pertaining to the method of the present invention are summarized below, wherein $TaBr_5$ and $SiI_4$ are included as exemplary tantalum source precursors and silicon-containing compounds:

Plasma-promoted or thermal CVD:

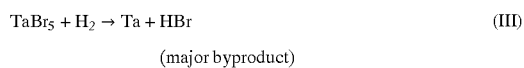

(major byproduct)

Plasma-promoted CVD:

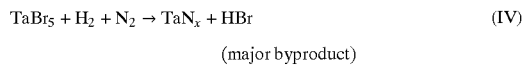

(major byproduct)

Thermal CVD:

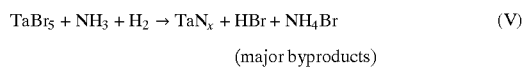

(major byproducts)

Plasma-promoted or thermal CVD:

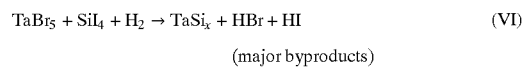

(major byproducts)

Plasma-promoted CVD:

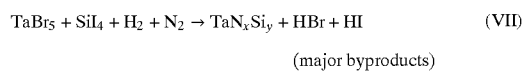

(major byproducts)

Thermal CVD:

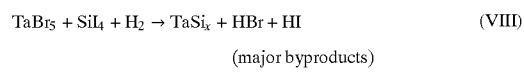

(major byproducts)

-continued

Thermal CVD:

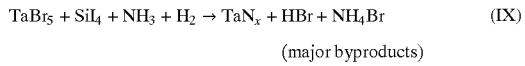

(major byproducts)

The invention, as well as the appearance and composition of the pure tantalum and other tantalum-based films deposited according to the method of the present invention, and their structural and electrical properties, will now be described in accordance with the following non-limiting examples:

EXAMPLE 1

Pure tantalum films were prepared according to a plasma-promoted CVD method in a standard CVD deposition reactor chamber. The source precursor was tantalum pentabromide with a sublimation temperature in the range of 140° C. to 200° C. Films were prepared under working reaction pressures inside the deposition reactor of from 100 mtorr to 10 torr. The carrier gas was hydrogen having a flow rate ranging between 10 standard cm$^3$/min to 100 standard cm$^3$/min. The reactant gas was also selected to be hydrogen with a flow rate ranging between 100 standard cm$^3$/min to 1000 standard cm$^3$/min. The substrate temperature ranged from 300° C. to 500° C. RF plasma was used with a power density ranging from 0.1 W/cm$^2$ to 0.25 W/cm$^2$. The films were deposited on silicon and silicon dioxide wafer substrates.

Figure 2:
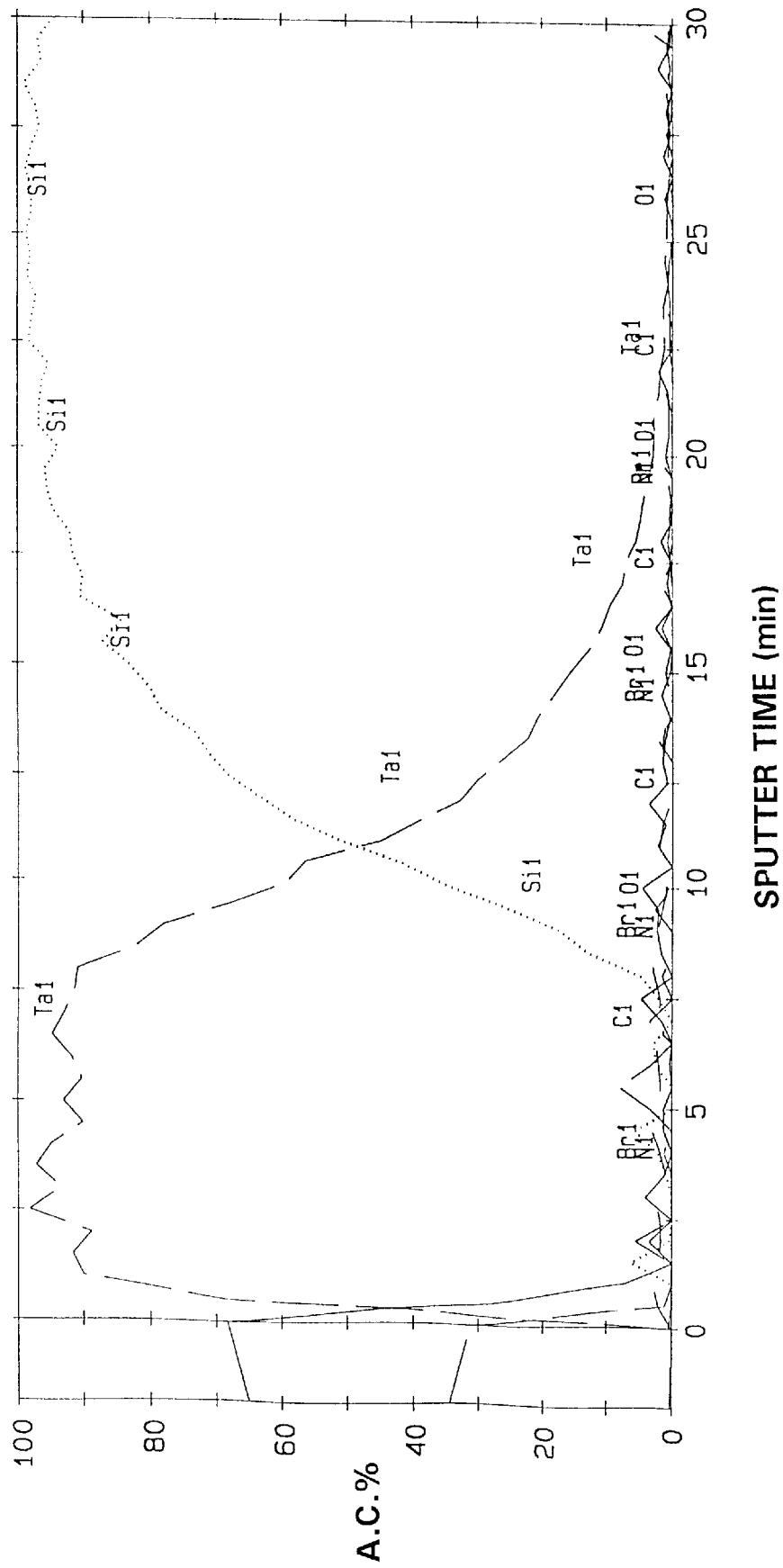
FIG. 2 is a representation of an x-ray photoelectron spectrum of the tantalum film of Example 1.

The tantalum films produced were metallic, continuous, and mirror-like. FIG. 1 shows an X-ray diffraction analysis of a tantalum film grown at 450° C. with 800 standard cm$^3$/min hydrogen, a sublimation temperature of 160° C., a hydrogen power density of 0.35 W/cm$^2$, and a working pressure in the reaction chamber of 700 mtorr. The film formed had a thickness measured in the direction perpendicular to the plane of the film of 350 Å on a silicon wafer substrate. The x-ray diffraction analysis of FIG. 1 shows multiple diffraction peaks corresponding to a polycrystalline tantalum phase. X-ray photoelectron spectroscopy was performed on the same sample using a Physical Electronics Model 10-360 spherical capacitor analyzer. The gold f$_{7/2}$ line at 83.8 eV was taken as reference line and the analyzer calibrated accordingly. All spectra were obtained using a pass energy of 5 eV at a resolution of 0.8 eV. A primary x-ray beam (Mg Kα, 1274 eV) of 15 keV and 300 W was employed. The analysis chamber pressure was in the 10$^{-10}$ torr range, and the results were standardized using a high purity sputtered tantalum sample. All samples were cleaned by sputtering before data acquisition. The choice of a standard of composition and chemical environment and bonding similar to that of the CVD films allowed high accuracy in x-ray photoelectron spectroscopic analysis. The results are based on the expectation that chemical and structural changes, if any, induced during the cleaning process are basically the same in the standard and CVD-produced films. The x-ray photoelectron spectrum is shown in FIG. 2 and indicates a pure tantalum phase with contaminant levels below the 1 at % detection limits of x-ray photoelectron spectroscopy.

Figure 3:
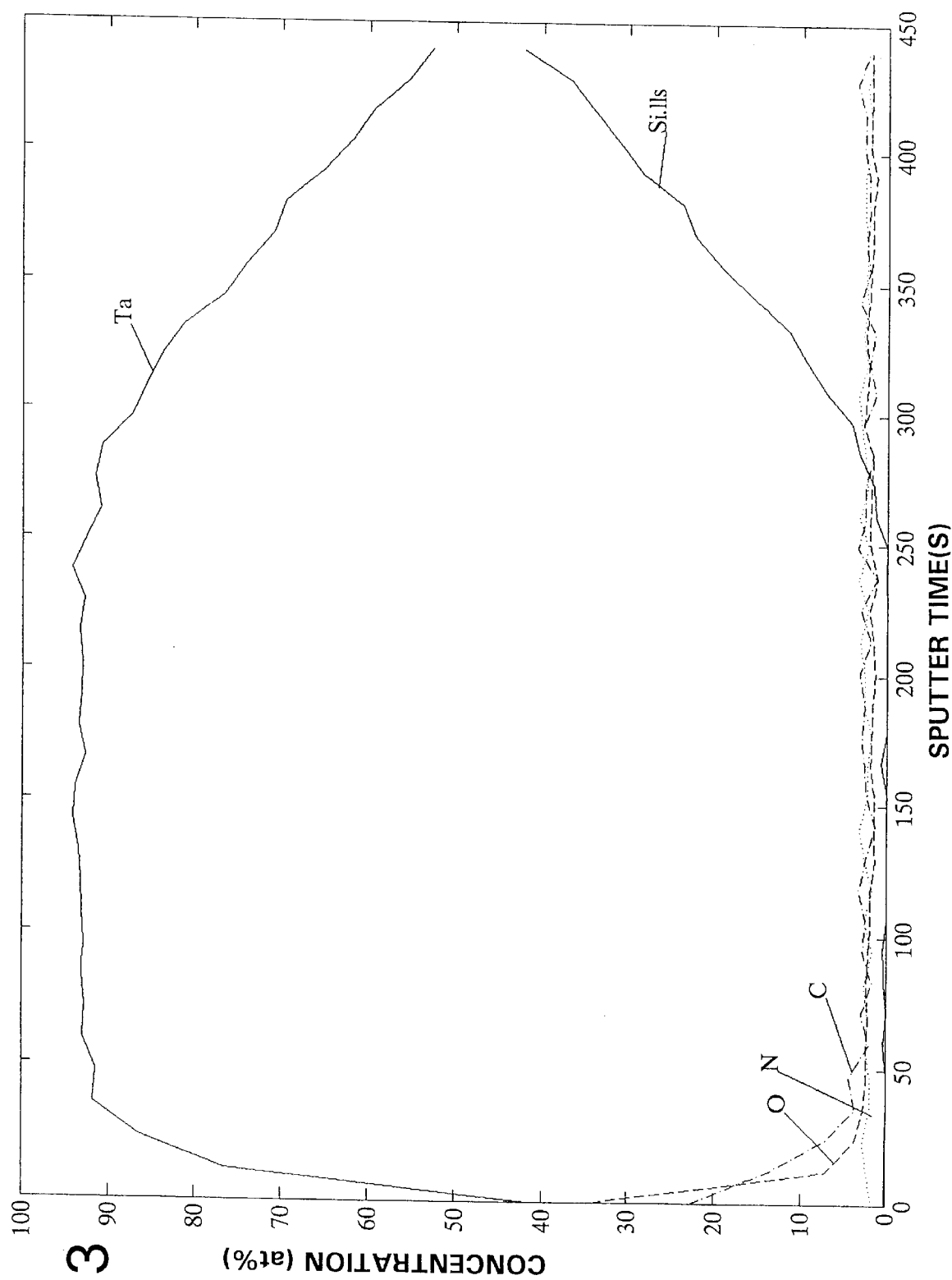
FIG. 3 is a representation of an Auger electron spectrum of the tantalum film of Example 1.

The chemical composition of the same film was further examined by Auger electron spectroscopy using a Physical Electronics Model 15-110B cylindrical mirror analyzer. The gold f$_{7/2}$ line at 83.8 eV was taken as reference line and the analyzer calibrated accordingly. All spectra were obtained using a pass energy of 23.5 eV. A primary electron energy of 5 keV at 1 mA was employed. The analysis chamber pressure was in the 10$^{-10}$ torr range, and the results were standardized using a high purity sputtered tantalum sample. All samples were cleaned by sputtering before data acquisition. The choice of a standard of composition and chemical environment and bonding similar to that of the CVD films allowed high accuracy in Auger electron spectroscopic analysis. As in the case of x-ray photoelectron spectroscopy, the results are based on the expectation that chemical and structural changes, if any, induced during the cleaning process are basically the same in the standard and plasma-promoted CVD-produced films. The Auger electron spectrum as shown in FIG. 3 confirms the x-ray photoelectron spectroscopic findings with respect to the purity of the tantalum phase, with contaminant levels below the 1 at % detection limits of Auger electron spectroscopy. Four point probe resistivity measurements found that film resistivity was 117 µohm-cm.

Figure 4:
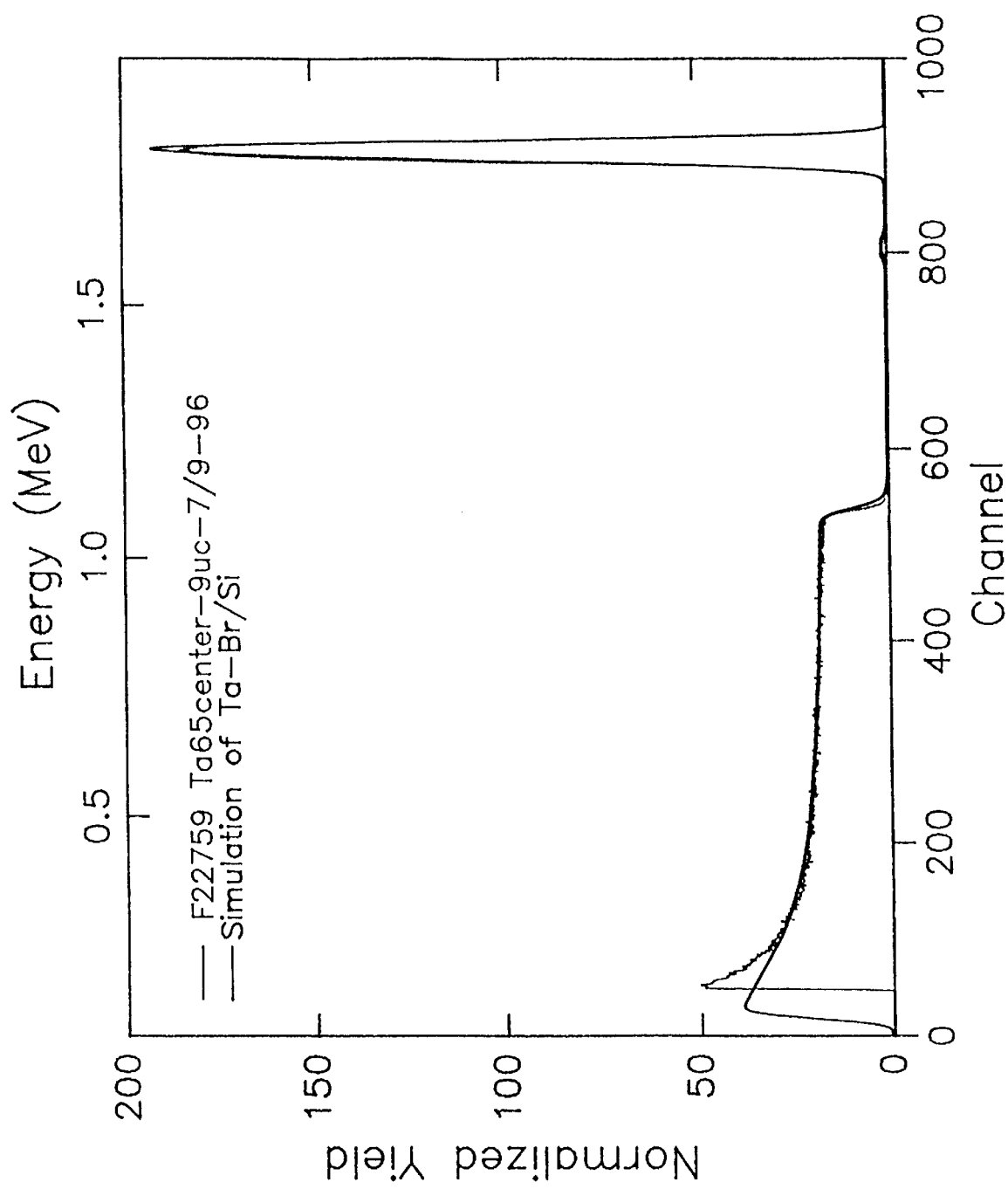
FIG. 4 is a representation of a Rutherford backscattering spectrum of the tantalum film of Example 1.

Rutherford backscattering spectra were taken using a 2 MeV He$^+$ beam, and calibrated with high-purity gold and carbon films and a bulk sample of silicon. Rutherford backscattering spectra are shown in FIG. 4. The measurements confirm the Auger electron spectroscopy and x-ray photoelectron spectroscopy findings with respect to the purity of the tantalum phase, especially in terms of the absence of heavy element contamination in the tantalum film, i.e., elements having an atomic number above 13. In particular, the Rutherford backscattering spectra indicated less than 3 at % bromine in the films.

The nature of the tantalum film with relation to the silicon substrate was examined next. The tantalum films were observed to adhere well to either silicon or silicon dioxide. Cross-section scanning electron microscopy analysis of film step coverage was also undertaken. "Conformal coverage" refers to a film or coating that evenly covers a substrate having a complex topography. The degree of evenness of the coating can be measured by, for example, examining the thickness of the coating along the walls and bottom of a hole in the substrate, and determining the variation in the thickness of the coating. This measurement yields a value for the step coverage, which is the ratio of the thickness at the bottom of the hole to that in the field of the substrate outside the hole. Cross-section scanning electron microscopy was carried out using a Zeiss DSM940 microscope, employing a 20 keV primary electron beam and a beam current of 4 µA. A cross-section scanning electron micrograph is shown in FIG. 5 for a 350 Å-thick tantalum film which shows conformal step coverage of 0.25 µm vias with an aspect ratio of 4 (defined as height of the via divided by its diameter).

Figure 5:
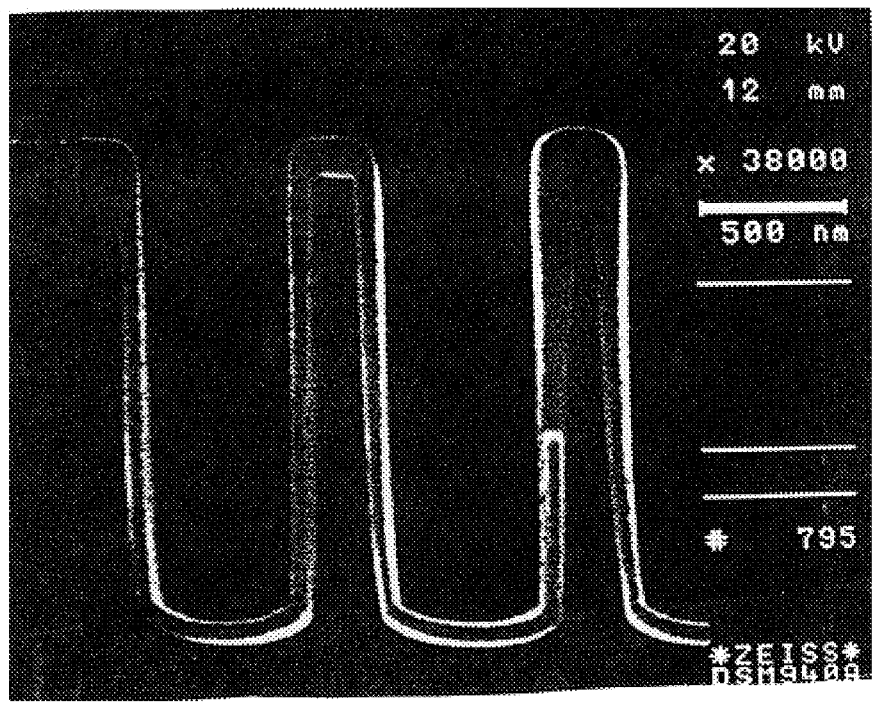
FIG. 5 is a cross section scanning electron microscope-magnified view of a silicon substrate upon which oxide via patterns, of diameter 0.25 μm and 4 to 1 aspect ratio, are formed and upon which the conformal tantalum coating of Example 1 has been deposited.

The micrograph of FIG. 5 shows that the tantalum film which was deposited onto a nominally 0.25 µm diameter trench with 4:1 aspect ratio substrate using plasma-promoted CVD had a step coverage which exceeded 80%. FIG. 5 demonstrates that even after an extended deposition time, which yielded a thick tantalum nitride film, plasma-promoted CVD used in the present inventive method provides a conformal coating with high step coverage. This film was prepared using hydrogen and tantalum pentabromide.

EXAMPLE 2

Pure TaN$_x$ films were prepared according to a thermal CVD method in a standard CVD deposition reactor chamber. The source precursor was tantalum pentabromide with sublimation temperatures ranging from 140° C. to 200° C. The films were prepared using a working pressure inside the deposition reactor of from 100 mtorr to 10 torr, and using hydrogen as the carrier gas at a flow rate of 10 standard cm$^3$/min to 100 standard cm$^3$/min. The nitrogen-containing reactant gas was ammonia with a flow rate of 100 standard cm$^3$/min to 1000 standard cm$^3$/min. The substrate temperature and reactor temperature ranged from 250° C. to 500° C. The films were deposited on silicon and silicon dioxide wafer substrates.

Figure 6:
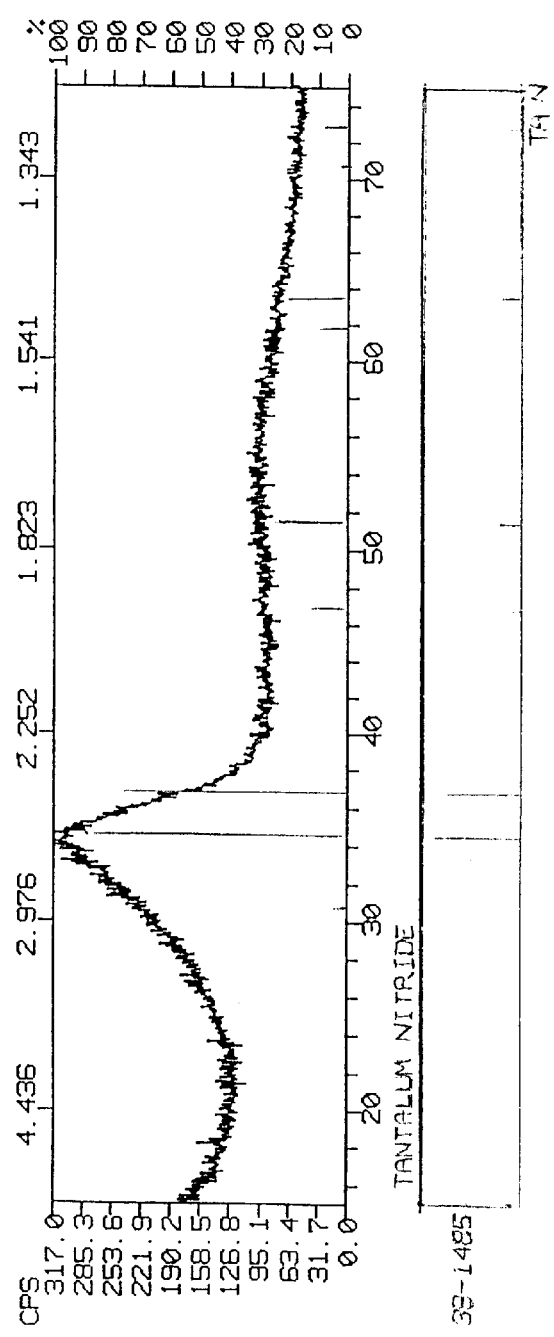
FIG. 6 is a representation of an x-ray diffraction pattern of a $TaN_x$ film produced by a thermal CVD reaction of $TaBr_5$ and ammonia in Example 2 according to one embodiment of the method of the invention.
Figure 7A:
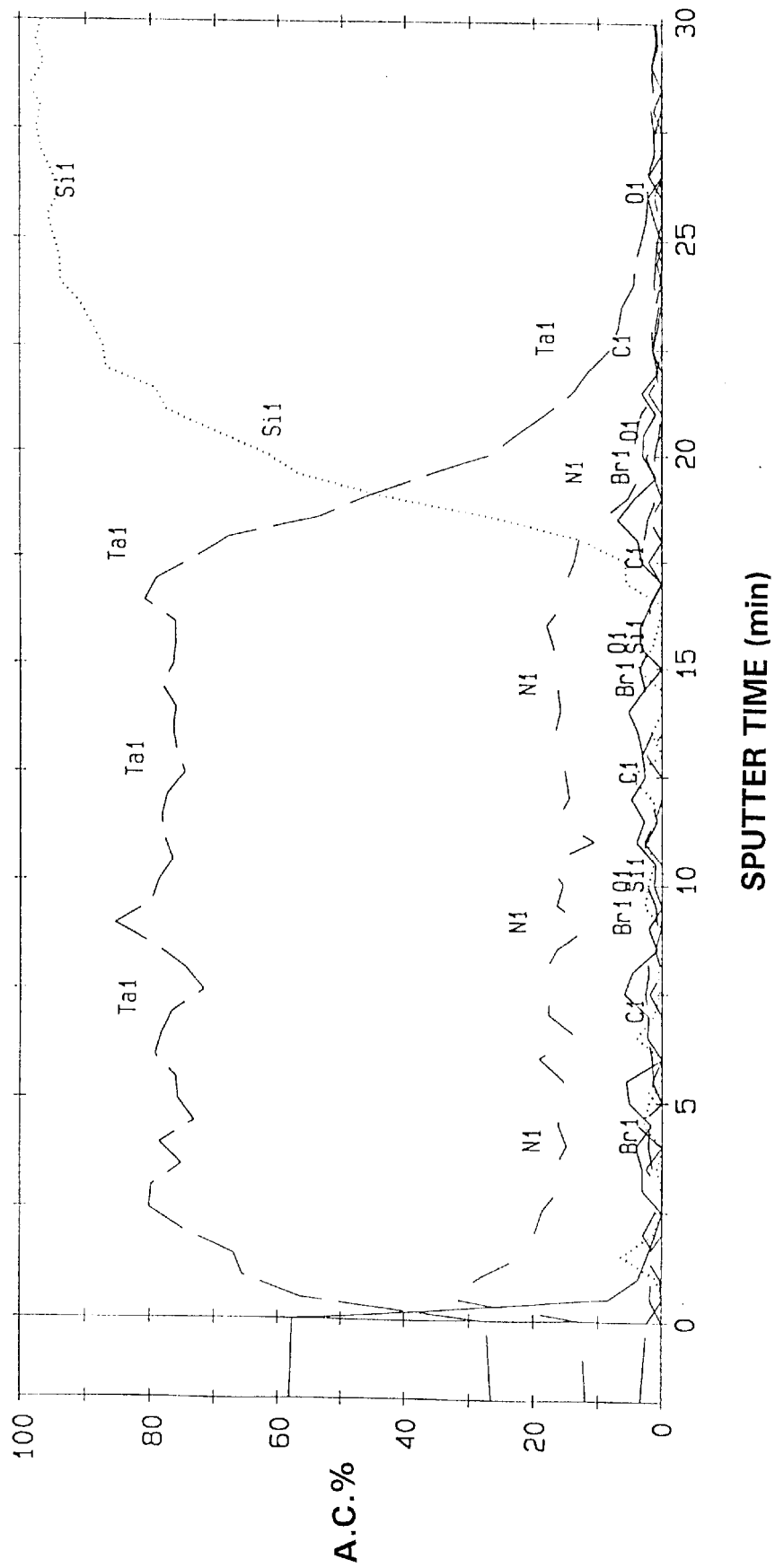
FIGS. 7a and 7b are representations of x-ray photoelectron spectra of the film of Example 2.
Figure 7B:
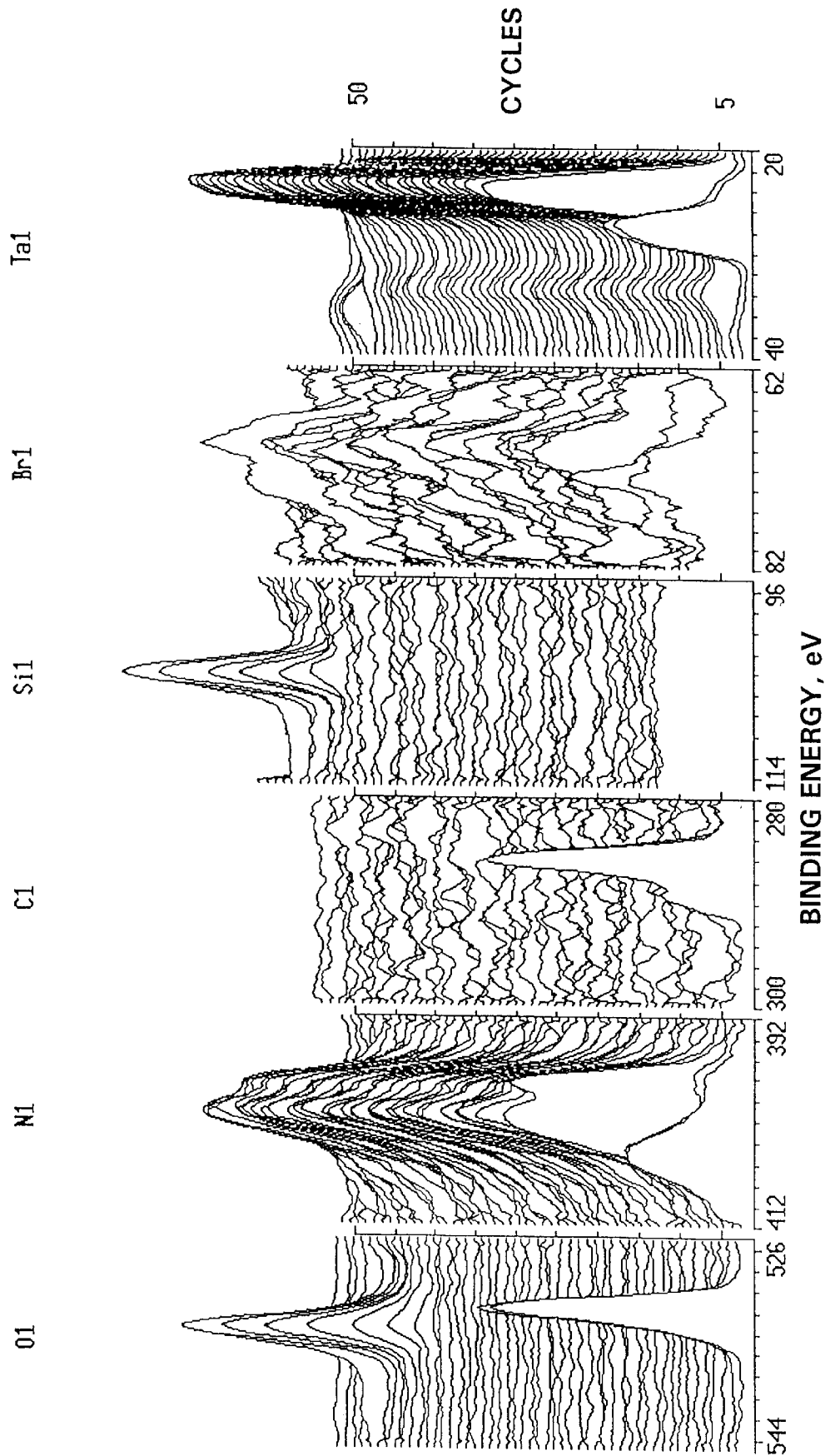

The tantalum nitride films produced were metallic, continuous, and mirror-like. X-ray diffraction analysis was undertaken on a TaN$_{1.2}$ film grown at 425° C. with 600 standard cm$^3$/min ammonia, which had a 170° C. sublimation temperature. The reactor working pressure was 950 mtorr. FIG. 6 shows the x-ray diffraction pattern for that film which had a film thickness of 1900 Å and which was deposited on a silicon substrate. The x-ray diffraction pattern showed diffraction peaks corresponding to a mostly amorphous TaN$_{1.2}$ phase. X-ray photoelectron spectroscopy was performed using a Physical Electronics Model 10-360 spherical capacitor analyzer. The gold $f_{7/2}$ line at 83.8 eV was taken as reference line and the analyzer calibrated accordingly. All spectra were obtained using a pass energy of 5 eV at a resolution of 0.8 eV. A primary x-ray beam (Mg Ka, 1274 eV) of 15 keV and 300 W was used. The analysis chamber pressure was in the $10^{-10}$ torr range, and the results were standardized using a high purity sputtered TaN sample. All samples were cleaned by sputtering before data acquisition. The choice of a standard of composition and chemical environment and bonding similar to that of the CVD films allowed high accuracy in x-ray photoelectron spectroscopic analysis. The results are based on the expectation that chemical and structural changes, if any, induced during the cleaning process are basically the same in the standard and CVD-produced films. The x-ray photoelectron spectrum is shown in FIG. 7a for the same sample and shows a pure TaN$_{1.2}$ phase with contaminant levels below the 1 at % detection limits of x-ray photoelectron spectroscopy. The x-ray photoelectron high resolution spectrum of the N peak in TaN yielded a binding energy of 398.2 eV which corresponds to a nitride phase as shown in FIG. 7b.

Figure 8:
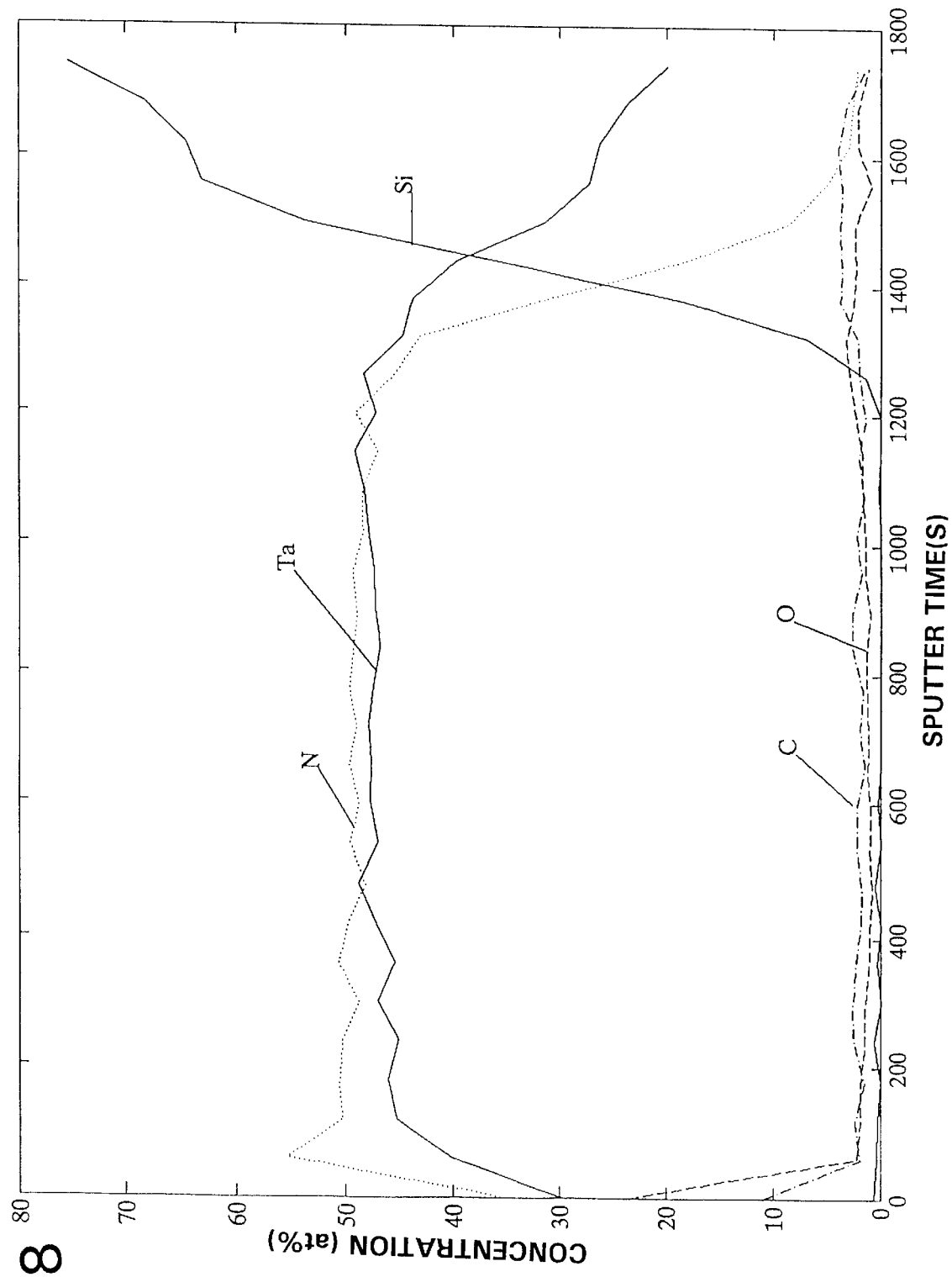
FIG. 8 is a representation of an Auger electron spectrum of the film of Example 2.

The chemical composition of the film was also examined by Auger electron spectroscopy using a Physical Electronics Model 15-110B cylindrical mirror analyzer. The gold $f_{7/2}$ line at 83.8 eV was taken as reference line and the analyzer calibrated accordingly. All spectra were obtained using a pass energy of 23.5 eV. A primary electron energy of 5 keV at 1 mA was employed. The analysis chamber pressure was in the $10^{-10}$ torr range, and the results were standardized using a high-purity sputtered TaN sample. All samples were cleaned by sputtering before data acquisition. The choice of a standard of composition and chemical environment and bonding similar to that of the CVD films allowed high accuracy in Auger electron spectroscopic analysis. As in the case of x-ray photoelectron spectroscopy, the results are based on the expectation that chemical and structural changes, if any, induced during the cleaning process are basically the same in the standard and thermal CVD-produced films. FIG. 8 shows the Auger electron spectroscopic results which confirm the x-ray photoelectron spectroscopic findings with respect to the purity of the TaN phase, with contaminant levels below the 1 at% detection limits of Auger electron spectroscopy. Four point probe resistivity measurements found a film resistivity of 2×10$^4$ $\mu$ohm-cm.

Figure 9:
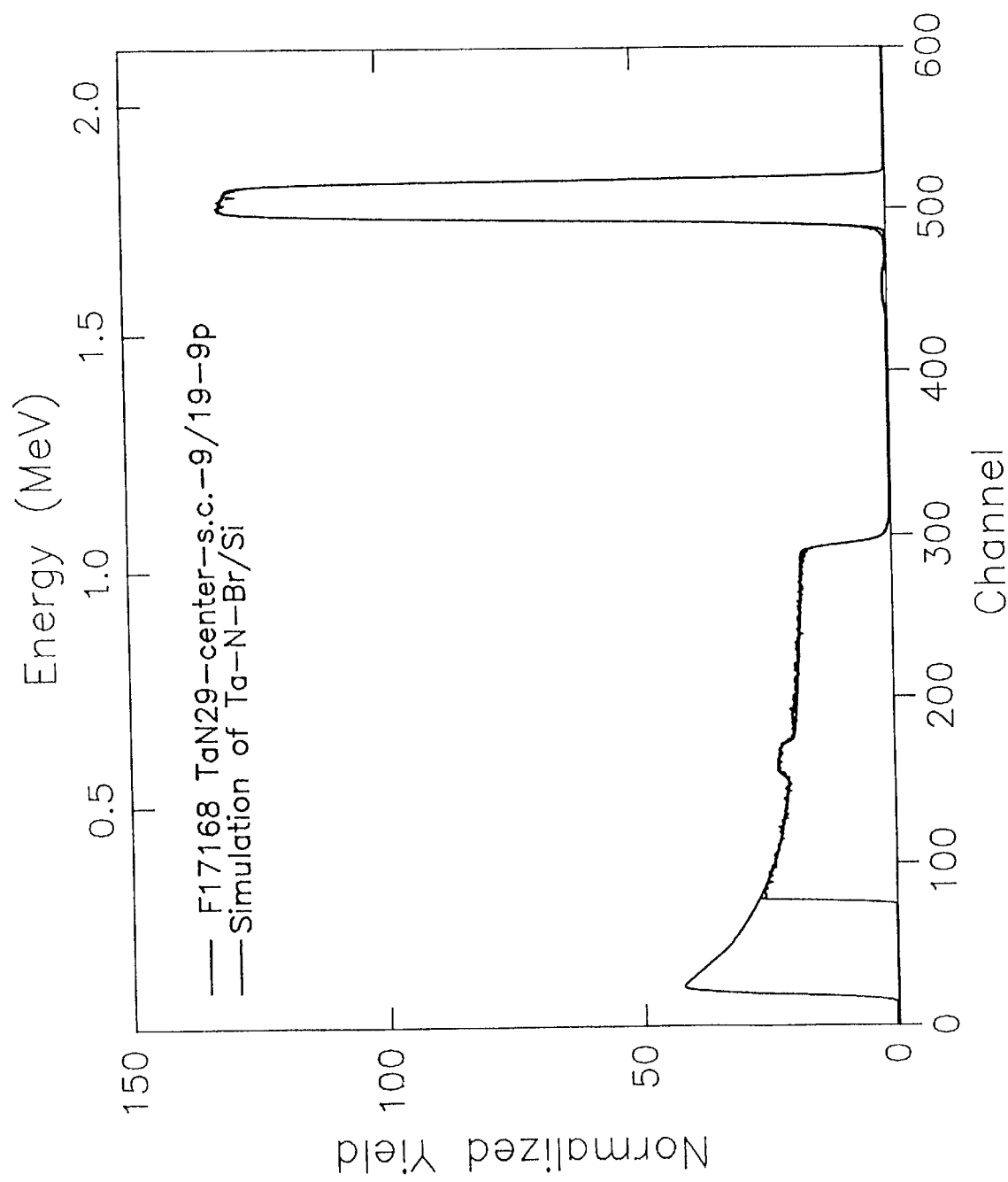
FIG. 9 is a representation of a Rutherford backscattering spectrum of the film of Example 2.
Figure 11:
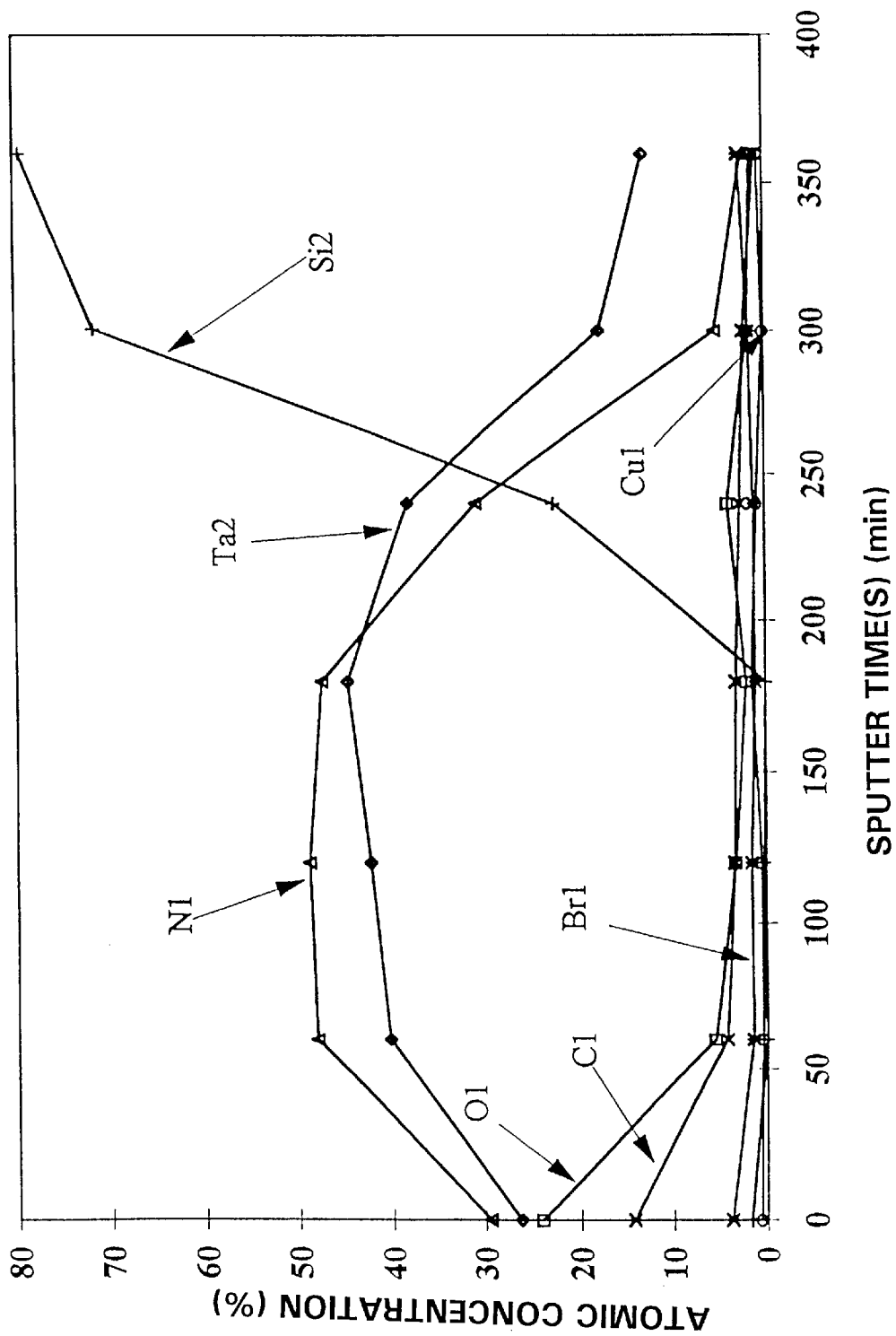
FIG. 11 is a representation of an Auger electron spectrum of a tantalum-based bilayered film grown in situ including a tantalum layer coated with a $TaN_x$ layer, the tantalum layer produced by a plasma-promoted CVD reaction of $TaBr_5$ and hydrogen, and the $TaN_x$ layer deposited by a thermal CVD reaction of $TaBr_5$ and ammonia.

Rutherford backscattering spectra were also taken using a 2 MeV He$^+$ beam, and calibrated with a high-purity sputtered TaN film and a bulk sample of silicon. Rutherford backscattering measurements for the film are shown in FIG. 9 and confirm the Auger electron and x-ray photoelectron spectroscopic findings with respect to the purity of the TaN phase, especially in terms of the absence of heavy element contamination in the TaN$_{1.2}$ film. In particular, the Rutherford backscattering spectra indicated less than 1 at % bromine in the films.

The nature of the TaN$_{1.2}$ film with respect to the silicon substrate was also examined. The tantalum nitride films were observed to adhere well to either silicon or silicon dioxide. Cross section scanning electron microscopic analysis of film step coverage was also undertaken. The cross-section scanning electron microscopy was carried out on a Zeiss DSM940 microscope, employing a 20 keV primary electron beam and a beam current of 4 $\mu$A. A cross-section scanning electron micrograph is shown in FIG. 10 for the 1900 Å-thick TaN film formed on silicon as described above and shows conformal step coverage of 0.25 $\mu$m vias with an aspect ratio of 4.

Figure 10:
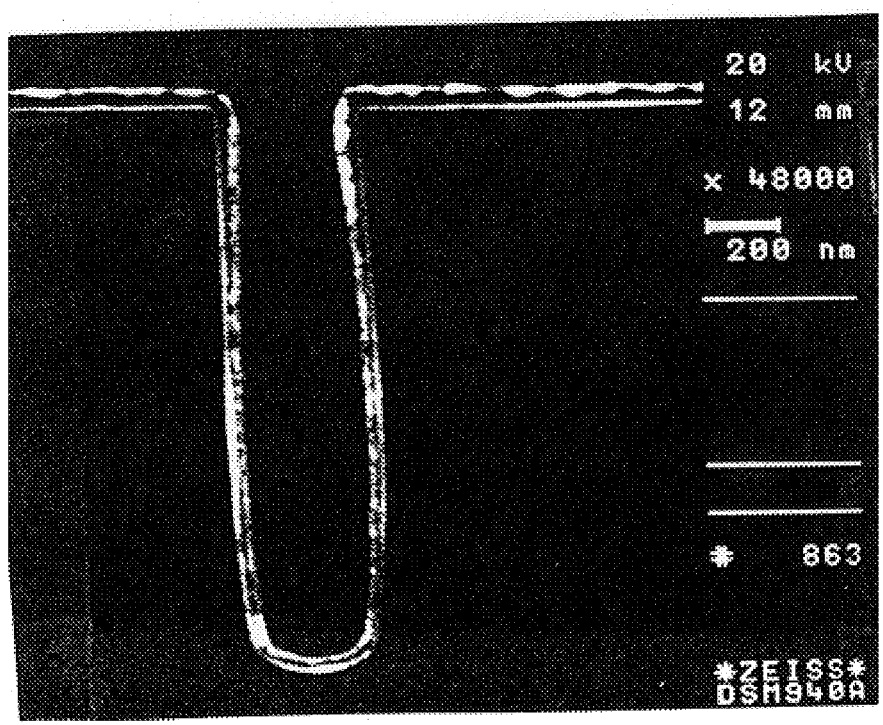
FIG. 10 is a cross section scanning electron microscope-magnified view of a silicon substrate upon which oxide via patterns, of diameter 0.25 μm and 4 to 1 aspect ratio, are formed and upon which the conformal film of Example 2 has been deposited.

The micrograph of FIG. 10 shows that a tantalum nitride film which was deposited onto a nominally 0.25 $\mu$m diameter trench with 4:1 aspect ratio substrate using thermal CVD and the method of the present invention provides step coverage for the film which exceeds 80%. This micrograph demonstrates that even after extended deposition time, which yields a thick tantalum nitride film, using thermal CVD and the method of the invention provides a conformal coating with high step coverage. The film was prepared from tantalum pentabromide as the source precursor and ammonia as the reactant gas.

EXAMPLE 3

Plasma-promoted chemical vapor deposition was carried out using TaBr$_5$ as the tantalum source precursor. The source precursor was placed in a sublimator which was heated by a combination of heating tape and associated power supply to temperatures between 140° C. and 200° C. during the CVD process. A mass flow controller, which was isolated from the sublimator by a high vacuum valve, was controlled to a flow of between 10 to 100 standard cm$^3$/min of hydrogen carrier gas into the sublimator. The mixture of source precursor vapor and hydrogen carrier gas was then transported into the CVD reactor. All transport and delivery lines and high vacuum isolation valves were maintained at temperatures in the range 140° C. and 200° C., using a combination of heating tape and associated power supply, to prevent precursor recondensation.

The deposition was carried out in a six-inch wafer, cold-wall, stainless steel CVD reactor. It was equipped with a diode-type, parallel plate-type plasma configuration made of two electrodes. The upper plate served as the active electrode and was driven by the radio frequency (13.56 MHZ) power supply. It was constructed in a "mesh" type pattern to allow unconstricted reactant flow to the substrate. A hydrogen plasma was used for in situ pre-deposition substrate cleaning at plasma power densities in the range of 0.1 to 0.5 W/cm$^2$, while a hydrogen plasma with power density of 0.1 to 0.25 W/cm$^2$ was used during actual deposition. The substrate (wafer) was placed on the lower, grounded plasma electrode, and was heated to processing temperatures in the range of from 350° to 500° C. by a resistive heater. To guarantee process cleanliness, the reactor was periodically baked under a nitrogen or argon atmosphere to below 0.3 torr and then pumped down to below $10^{-6}$ torr for an hour at 150° C. The pumping stack consisted of two pumping packages, the first was a cryogenic-based pump, and the second was a roots blower-based pump, and was isolated from the reactor by the high vacuum gate valve. The cryogenic pump-based package was used to ensure high vacuum base pressure in the reactor, while the roots blower-based package was employed for appropriate handling of the high gas throughput during actual CVD runs. A high vacuum load lock system was used for transport and loading of six-inch wafers into the reactor. Finally, a side line was used to feed the hydrogen (H$_2$) gas into the reactor. The hydrogen flow was 100 to 1000 liters/minute and was controlled by the mass flow controller and associated isolation valve.

The tantalum films produced were metallic, continuous, and mirror-like. Their structural and electrical properties as well as chemical composition, were thoroughly analyzed by x-ray diffraction, x-ray photoelectron spectroscopy, Rutherford backscattering, four point probe, and cross-sectional scanning electron microscopy as discussed above in Examples I and II. Based on these analyses, the tantalum films exhibited properties typical of tantalum films as described in Example I.

EXAMPLE 4

Deposition of a tantalum nitride film of formula TaN was performed by thermal CVD using tantalum pentabromide as the chemical source precursor. The runs were performed under processing conditions similar to those described in Example 3 for pure tantalum deposition, except that no plasma was used during actual deposition. In this case, the substrate was heated to processing temperatures in the range of 250° C. to 500° C. by a resistive heater, and ammonia was used as a nitrogen-containing reactant gas and carrier gas. The NH$_3$ flow of 100 to 1000 liters/minute through a sideline was controlled by the mass flow controller and associated isolation valve.

The tantalum nitride films thus produced were metallic, continuous, and mirror-like. Their structural and electrical properties as well as chemical composition, were thoroughly analyzed by x-ray diffraction, x-ray photoelectron spectroscopy, Rutherford backscattering, four point probe, and cross-sectional scanning electron microscopy. Based on these analyses, the films exhibited properties typical of the tantalum nitride films as described in Example 2 above.

EXAMPLE 5

In situ sequential deposition of pure tantalum and tantalum nitride bilayers was performed using tantalum pentabromide as a source precursor. The pure tantalum layer was first grown by using plasma-promoted CVD described above in Example 3 with argon as the carrier gas. Then the plasma was turned off and the gas changed from argon to ammonia which also functioned as the nitrogen-containing reactant gas and a tantalum nitride layer was grown on top of the tantalum layer using thermal CVD in the manner described in Example 4. The films were analyzed as described earlier and found to exhibit properties for tantalum and tantalum nitride as described in Examples 1 and 2. Under some conditions, nitrogen-doping of the tantalum layer was also possible during the tantalum nitride deposition phase. An example of this is shown in accordance with the film formed in Example 2 and is exemplified in the Auger electron spectrum as shown in FIG. 10.

The films prepared according to the inventive methods are seen to have electronic grade purity, and thus are well suited for use in, for example, microelectronic applications where purity demands are extremely stringent. The films prepared according to the claimed method of the invention have carbon and oxygen impurity levels of less than 1 at %. The films prepared from the method of the invention also have little or no halogen contamination, where the halogens are iodine, bromine, chlorine, or fluorine. Thus, films can be achieved by the method of the invention which have halogen contamination of less than about 5 at %, and more preferably less than about 1 at %.

Due in part to their high purity, the pure tantalum and other tantalum-based films formed by the invention are seen to have desirably low resistivities. The inventive films have a resistivity of about 50 to about 5,000 μohm-cm, preferably from about 50 to about 1000 μohm-cm, and more preferably from about 40 to about 150 μohm-cm.

In contrast to prior art chemical vapor deposition methods, the method of the present invention provides films with electronic grade purity, due to the near or complete absence of carbon, oxygen, fluorine, or halide contamination. In contrast to sputtering techniques, our invention provides superior coverage of features intrinsic in microelectronic device manufacture.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for the chemical vapor deposition of a film comprising tantalum onto a substrate, comprising
    (a) introducing into a deposition chamber:
        (i) a substrate;
        (ii) a single source precursor in a vapor state and having formula (I):

$$\text{Ta}(I_{5-m-n-p})(Br_{m-p})(Cl_{n-p})(R_p) \qquad (I)$$

wherein m is an integer from 0 to 5, n is an integer from 0 to 4, p is an integer from 0 to 4, and R is selected from the group consisting of hydrogen, and lower alkyl; and
        (iii) at least one carrier gas; and
    (b) maintaining a temperature of said substrate within said chamber of from about 70° C. to about 675° C. for a period of time sufficient to react said single source precursor with said at least one carrier gas and to deposit a film comprising tantalum which is selected from the group consisting of tantalum films, and tantalum nitride films on said substrate.

2. The method according to claim 1, wherein said at least one carrier gas is selected from the group consisting of hydrogen, nitrogen, ammonia, hydrazine, and nitrous oxide.

3. The method according to claim 2, wherein the carrier gas further comprises an inert gas selected from the group consisting of helium, neon, argon, krypton, and xenon.

4. The method according to claim 1, wherein a flow rate of said at least one carrier gas is greater than 0 and no greater than about 10 l/min.

5. The method according to claim 1, further comprising introducing into said chamber a plasma having a plasma power density of from about 0.01 W/cm$^2$ to about 10 W/cm$^2$ for a period of time sufficient to deposit a film comprising tantalum on the substrate.

6. The method according to claim 5, wherein said plasma has a frequency of from about 0 Hz to about 10$^8$ kHz.

7. The method according to claim 1, further comprising applying an electrical bias to said substrate, wherein said electrical bias is at least one of a direct current bias, a low radio frequency bias of less than 500 kHz, a high radio frequency bias of from 500 kHz to $10^6$ kHz, or a microwave frequency bias of from $10^6$ kHz to about $10^8$ kHz bias.

8. The method according to claim 7, wherein said electrical bias has a power density greater than 0 Watts/cm$^2$ and less than or equal to about $10^3$ Watts/cm$^2$.

9. The method according to claim 8, wherein said electrical bias has a power density greater than 0 Watts/cm$^2$ and less than or equal to about 10 Watts/cm$^2$.

10. The method according to claim 1, wherein said substrate comprises a material selected from the group consisting of metal, glass, and polymer.

11. The method according to claim 10, wherein said substrate comprises a metal selected from the group consisting of aluminum, beryllium, cadmium, cerium, chromium, cobalt, copper, gallium, gold, iron, lead, manganese, molybdenum, nickel, palladium, platinum, rhenium, rhodium, silver, steel, iron, strontium, tin, titanium, tungsten, zinc, zirconium, and alloys and compounds thereof.

12. The method according to claim 1, wherein said temperature of said substrate within said chamber is maintained from about 250° C. to about 500° C.

13. The method according to claim 1, wherein said source precursor is tantalum pentabromide.

14. The method according to claim 1, wherein said at least one carrier gas is hydrogen.

15. The method according to claim 1, wherein said film comprising tantalum is a pure tantalum film;

said at least one carrier gas comprises hydrogen; and said temperature of said substrate within said chamber is maintained at from about 100° C. to about 675° C.

16. The method according to claim 15, wherein the carrier gas further comprises a gas selected from the group consisting of helium, neon, argon, krypton, and xenon.

17. The method according to claim 1, wherein said film comprising tantalum is a TaN$_x$ film, wherein x is greater than 0 and less than or equal to about 2; and step (a) further comprises introducing into said chamber:
(iv) a reactant gas comprising nitrogen, which may be the same or different from said at least one carrier gas.

18. The method according to claim 17, wherein said reactant gas comprising nitrogen is selected from the group consisting of nitrous oxide, ammonia, nitrogen, and hydrazine.

19. The method according to claim 1, further comprising:

(c) depositing a second film comprising tantalum on said film deposited on said substrate for forming a multi-layered structure while said substrate remains fixed in said chamber, wherein said second film comprising tantalum is selected from the group consisting of a pure tantalum film, a TaN$_x$ film, wherein x is greater than 0 and less than or equal to about 2; a TaSi$_y$ film, wherein y is greater than 0 and less than or equal to about 2; and a TaN$_x$Si$_y$ film.

20. The method according to claim 19, wherein said second film is a pure tantalum film and step (c) further comprises:

introducing into said chamber said source precursor in the vapor state and said at least one carrier gas, wherein said at least one carrier gas comprises hydrogen; and maintaining said chamber at a temperature of from about 100° C. to about 675° C.

21. The method according to claim 20, wherein the carrier gas further comprises an inert gas selected from the group consisting of helium, neon, argon, krypton, and xenon.

22. The method according to claim 19, wherein said second film is a TaN$_x$ film, wherein x is greater than 0 and less than or equal to about 2 and step (c) further comprises:

introducing into said chamber
said source precursor in the vapor state;
said at least one carrier gas; and
a reactant gas comprising nitrogen, which may be the same or different from said at least one carrier gas; and maintaining said chamber at a temperature of from about 100° C. to about 675° C.

23. The method according to claim 19, wherein said second film is a TaSi$_y$ film, wherein y is greater than 0 and less than or equal to about 3; and step (c) further comprises:

introducing into said chamber:
said source precursor in the vapor state;
said at least one carrier gas, wherein said at least one carrier gas is selected from the group consisting of hydrogen, oxygen, fluorine, chlorine, carbon monoxide, carbon dioxide, and water vapor; and
a compound comprising silicon in a vapor state.

24. The method according to claim 23, wherein the carrier gas further comprises an inert gas selected from the group consisting of helium, neon, argon, krypton, and xenon.

25. The method according to claim 1, wherein said substrate comprises silicon; and said method further comprises:

(c) heating said substrate and said deposited film comprising tantalum to a temperature of from about 700° C. to about 950° C. for providing silicon to said deposited film comprising tantalum.

26. A method for the chemical vapor deposition of a TaN$_x$Si$_y$ film onto a substrate, wherein x is greater than 0 and less than or equal to about 2 and y is greater than 0 and less than or equal to about 3, comprising (a) introducing into a deposition chamber:
(i) a substrate:
(ii) a source precursor in a vapor state and having formula (I):

$$\text{Ta}(I_{5-m-n-p})(Br_{m-p})(Cl_{n-p})(R_p) \qquad (I)$$

wherein m is an integer from 0 to 5, n is an integer from 0 to 4, p is an integer from 0 to 4, and R is selected from the group consisting of hydrogen, and lower alkyl;

(iii) at least one carrier gas;
(iv) a compound comprising silicon in a vapor state; and
(v) a reactant gas comprising nitrogen, which may be the same or different from the at least one carrier gas; and (b) maintaining a temperature of said substrate within said chamber of from about 70° C. to about 675° C. for a period of time sufficient to deposit said TaN$_x$Si$_y$ film on said substrate, wherein said at least one carrier gas is selected from the group consisting of hydrogen, helium, oxygen, fluorine, neon, chlorine, argon, krypton, xenon, nitrogen, ammonia, hydrazine, nitrous oxide, carbon monoxide, carbon dioxide, and water vapor.

27. The method according to claim 26, wherein said compound comprising silicon has formula (II):

$$Si(I_{4-m-n-p})(Br_{m-p})(Cl_{n-p})(R_p) \quad (II)$$

wherein m is an integer from 0 to 4, n is an integer from 0 to 4, p is an integer from 0 to 4, and R is selected from the group consisting of hydrogen, and lower alkyl.

28. A method for the chemical vapor deposition of a film comprising tantalum onto a substrate, comprising (a) introducing into a deposition chamber:
  (i) a substrate;
  (ii) a source precursor in a vapor state and having a formula (I):

$$Ta(I_{5-m-n-p})(Br_{m-p})(Cl_{n-p})(R_p) \quad (I)$$

wherein m is an integer from 0 to 5, n is an integer from 0 to 4, p is an integer from 0 to 4, and R is selected from the group consisting of hydrogen, and lower alkyl; and
  (iii) at least one carrier gas;

(b) maintaining a temperature of said substrate within said chamber of from about 70° C. to about 675° C. for a period of time sufficient to deposit a film comprising tantalum on said substrate; and (c) depositing a second film comprising tantalum on said film deposited on said substrate for forming a multi-layered structure while said substrate remains fixed in said chamber, wherein said second film comprising tantalum is a $TaN_xSi_y$ film, wherein x is greater than 0 and less than or equal to about 2, y is greater than 0 and less than or equal to about 3 and said second film is deposited by introducing into said chamber:
  said source precursor in the vapor state;
  said at least one carrier gas;
  a compound comprising silicon in a vapor state; and
  a reactant gas comprising nitrogen, which may be the same or different from the at least one carrier gas.

* * * * *